US012804926B2

(12) United States Patent
Mitsuzuka et al.

(10) Patent No.: US 12,804,926 B2
(45) Date of Patent: Nov. 17, 2026

(54) SEMICONDUCTOR DEVICE

(71) Applicant: FUJI ELECTRIC CO., LTD., Kanagawa (JP)

(72) Inventors: Kaname Mitsuzuka, Matsumoto-city (JP); Yuki Karamoto, Matsumoto-city (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 712 days.

(21) Appl. No.: 17/847,167

(22) Filed: Jun. 23, 2022

(65) Prior Publication Data

US 2022/0328669 A1 Oct. 13, 2022

Related U.S. Application Data

(63) Continuation of application No. PCT/JP2021/014138, filed on Apr. 1, 2021.

(30) Foreign Application Priority Data

Jul. 3, 2020 (JP) ................................ 2020-115759

(51) Int. Cl.
*H10D 12/00* (2025.01)
*H10D 62/13* (2025.01)
(Continued)

(52) U.S. Cl.
CPC ......... *H10D 12/481* (2025.01); *H10D 62/133* (2025.01); *H10D 62/393* (2025.01); *H10D 64/017* (2025.01); *H10D 64/513* (2025.01)

(58) Field of Classification Search
CPC ............... H10D 12/481; H10D 64/017; H10D 64/513
See application file for complete search history.

(56) References Cited

U.S. PATENT DOCUMENTS 5,455,450 A 10/1995 Leduc
10,749,025 B2 8/2020 Naito
(Continued)

FOREIGN PATENT DOCUMENTS

CN 105706238 A 6/2016
EP 0619610 A1 10/1994
(Continued)

OTHER PUBLICATIONS (ISA/237) Written Opinion of the International Search Authority for International Patent Application No. PCT/JP2021/014138, issued/mailed by the Japan Patent Office on Jul. 6, 2021.
(Continued)

*Primary Examiner* — Shaun M Campbell

(57) ABSTRACT

Provided is a semiconductor device including a gate trench portion and a dummy trench portion adjacent to the gate trench portion. The semiconductor device may include: a drift region of a first conductivity type, provided in a semiconductor substrate; a base region of a second conductivity type, provided above the drift region; an emitter region of the first conductivity type, with a doping concentration higher than the drift region, provided above the base region; and a contact region of the second conductivity type, with a doping concentration higher than the base region, provided above the base region. The contact region may be provided below the lower end on the dummy trench portion side of the emitter region in the mesa portion between the gate trench portion and the dummy trench portion.

14 Claims, 27 Drawing Sheets

(51) Int. Cl.

| | |
|---|---|
| ***H10D 62/17*** | (2025.01) |
| ***H10D 64/01*** | (2025.01) |
| ***H10D 64/27*** | (2025.01) |

(56) References Cited

U.S. PATENT DOCUMENTS

| | | | | |
|---|---|---|---|---|
| 2008/0012040 | A1 | 1/2008 | Saito | |
| 2009/0289264 | A1 | 11/2009 | Matsuki | |
| 2010/0308400 | A1 | 12/2010 | Darwish | |
| 2012/0217577 | A1 | 8/2012 | Hashimoto | |
| 2013/0001638 | A1 | 1/2013 | Yoshikawa | |
| 2014/0054644 | A1* | 2/2014 | Hikasa | H10D 64/513 257/139 |
| 2015/0108565 | A1 | 4/2015 | Darwish | |
| 2015/0340480 | A1* | 11/2015 | Matsuura | H10D 12/481 257/144 |
| 2016/0247808 | A1 | 8/2016 | Horiuchi | |
| 2017/0141216 | A1 | 5/2017 | Abe | |
| 2017/0141217 | A1 | 5/2017 | Shirakawa | |
| 2018/0182754 | A1 | 6/2018 | Naito | |
| 2018/0337233 | A1* | 11/2018 | Naito | H10D 64/231 |
| 2018/0366578 | A1 | 12/2018 | Naito | |
| 2019/0019861 | A1 | 1/2019 | Naito | |
| 2019/0027591 | A1* | 1/2019 | Naito | H10D 12/481 |
| 2019/0051739 | A1* | 2/2019 | Naito | H10D 12/481 |
| 2019/0088769 | A1* | 3/2019 | Matsushita | H10D 62/106 |
| 2019/0157264 | A1 | 5/2019 | Yoshida | |
| 2020/0161457 | A1* | 5/2020 | Takahashi | H10D 8/422 |
| 2020/0185520 | A1* | 6/2020 | Imagawa | H10D 30/668 |

FOREIGN PATENT DOCUMENTS

| | | | |
|---|---|---|---|
| JP | 2005175062 | A | 6/2005 |
| JP | 2009283540 | A | 12/2009 |
| JP | 2012178389 | A | 9/2012 |
| JP | 2017147433 | A | 8/2017 |
| JP | 2017168829 | A | 9/2017 |
| JP | 2018195798 | A | 12/2018 |
| JP | 2019004060 | A | 1/2019 |
| JP | 2019016802 | A | 1/2019 |
| JP | 2019195093 | A | 11/2019 |
| WO | 2012073609 | A1 | 6/2012 |
| WO | 2016133027 | A1 | 8/2016 |
| WO | 2018052098 | A1 | 3/2018 |

OTHER PUBLICATIONS

Office Action issued for counterpart Japanese Application No. 2023-123888, transmitted from the Japanese Patent Office on Nov. 5, 2024.

Office Action issued for counterpart Chinese Application 202180007468.1, issued by the State Intellectual Property Office of People's Republic of China on Sep. 22, 2025.

Office Action issued for counterpart German Application No. 112021000202.3, issued by the German Patent and Trademark Office on May 29, 2026.

* cited by examiner a−a'

100

100 d–d'
100

SEMICONDUCTOR DEVICE

The contents of the following Japanese patent application(s) are incorporated herein by reference:

NO. 2020-115759 filed in JP on Jul. 3, 2020, and
NO. PCT/JP2021/014138 filed in WO on Apr. 1, 2021

BACKGROUND

1. Technical Field

The present invention relates to a semiconductor device.

2. Related Art

Patent Document 1 describes "improving characteristics such as saturation current in semiconductor devices".

PRIOR ART DOCUMENT

Patent Document

Patent Document 1: Japanese Patent Application Publication No. 2018-195798
Patent Document 2: International Publication No. 2018/052098 Brochure

Technical Problems

A semiconductor device with improved latch-up withstand capability during switching is provided.

GENERAL DISCLOSURE

In a first aspect of the present invention, provided is a semiconductor device including a gate trench portion and a first trench portion adjacent to the gate trench portion. The semiconductor device may include: a drift region of a first conductivity type, provided in a semiconductor substrate; a base region of a second conductivity type, provided above the drift region; an emitter region of the first conductivity type, with a doping concentration higher than the drift region, provided above the base region; and a contact region of the second conductivity type, with a doping concentration higher than the base region, provided above the base region. In the mesa portion between the gate trench portion and the first trench portion, the contact region may be provided below the lower end of the emitter region.

The contact region may be in contact with the first trench portion.

In the mesa portion, the contact region may be spaced apart from the gate trench portion.

The contact region may be spaced apart from the gate trench portion by 0.6 μm in the trench array direction.

The contact region may be provided on the front surface of the semiconductor substrate on the sidewall of the first trench portion.

The semiconductor device may include an interlayer dielectric film provided above the semiconductor substrate. The emitter region may be connected electrically to the emitter electrode via the contact holes provided to penetrate the interlayer dielectric film.

The emitter region may extend from the gate trench portion to the first trench portion side beyond the contact holes in the trench array direction.

The semiconductor device may include an accumulation region of the first conductivity type with a higher doping concentration than the drift region between the drift region and the base region.

The semiconductor device may include a plurality of gate trench portions and a plurality of first trench portions. The ratio of the number of the plurality of gate trench portions to the number of the plurality of first trench portions may be 1:1.

The semiconductor device may include a plurality of gate trench portions and a plurality of first trench portions. The ratio of the number of the plurality of gate trench portions to the number of the plurality of first trench portions may be 1:2.

The emitter region may extend from the gate trench portion to the dummy trench portion in the trench array direction. The emitter region may terminate without reaching the first trench portion.

The emitter region may extend from the gate trench portion to the first trench portion in the trench array direction.

On the front surface of the semiconductor device, the contact regions and the emitter regions may be provided alternately to be in contact with each other with respect to the trench extending direction of the gate trench portion.

The first trench portion may be set at an emitter potential.

The first trench portion may be set at a gate potential.

The first trench portion may be a dummy trench. The emitter region may be in contact with the gate trench portion and is spaced apart from the first trench portion in the mesa portion. The contact region may be provided below the lower end of the first trench portion side of the emitter region in the mesa portion.

The first trench portion may include a dummy gate trench portion set to be at the gate potential, not in contact with the emitter region.

The first trench portion may include a dummy trench portion set at the emitter potential.

The emitter region may include a first emitter region in contact with the gate trench portion and spaced apart from the first trench portion in the mesa portion. The contact region may be provided below the lower end of the first trench portion side of the first emitter region in the mesa portion.

The emitter region may include a second emitter region in contact with the first trench portion and further spaced apart from the gate trench portion in the mesa portion. The contact region may be provided below the lower end of the gate trench portion side of the second emitter region in the mesa portion.

The first emitter regions and the second emitter regions may be provided alternately in the trench extending direction of the gate trench portion.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims. And all the combinations of the features described in the embodiment(s) are not necessarily essential to means provided by aspects of the invention.

In the present specification, one side in a direction parallel to a depth direction of a semiconductor substrate is referred to as "upper", and the other side is referred to as "lower". One surface of two principal surfaces of a substrate, a layer or some other member is referred to as a front surface, and the other surface is referred to as a back surface. The "upper", "lower", "front", and "back" directions are not limited to the gravitational direction or the direction of attachment to a substrate or the like at the time of mounting of a semiconductor device.

In the present specification, technical matters may be described using orthogonal coordinate axes of an X axis, a Y axis, and a Z axis. In the present specification, the XY plane is the plane parallel to the front surface of the semiconductor substrate, and the Z axis is the direction that forms a right-handed system with the X axis and Y axis and is parallel to the depth direction of the semiconductor substrate.

Although, in each implementation, a first conductivity type is exemplified as N type, and a second conductivity type is exemplified as P type, the first conductivity type may be P type, and the second conductivity type may be N type. In this case, the conductivity type of substrate, layers, regions and the like in each implementation respectively are of the opposite polarity.

In the present specification, it is meant that the electrons or holes are majority carriers in the layers or regions specified with N or P, respectively. Also, '+' and '−' attached on 'N' and 'P' respectively mean that the higher doping concentration and the lower doping concentration than the layer or region to which these symbols are not attached.

Figure 1A:
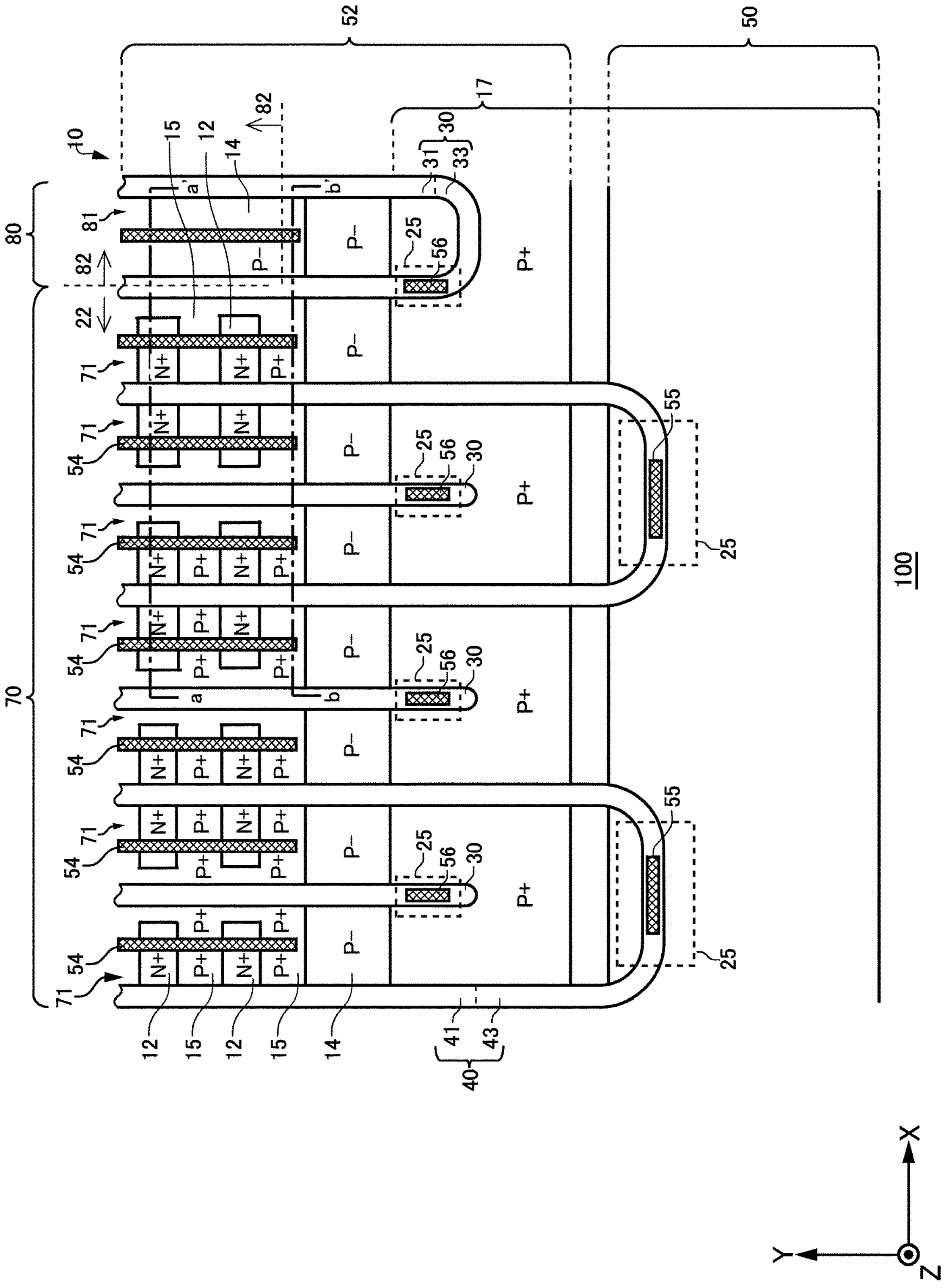
FIG. 1A illustrates a top view of a semiconductor device 100.

FIG. 1A illustrates an example of a top view of a semiconductor device 100. The semiconductor device 100 of the present example is a semiconductor chip including a transistor portion 70 and a diode portion 80. For example, the semiconductor device 100 is a trench-gate type RC-IGBT (Reverse Conducting Insulated Gate Bipolar transistor) with an array of a plurality of trench portions. In the present example, a plurality of trench portions are arrayed in the X axis direction and extend in the Y axis direction.

The transistor portion 70 is the region of the collector region 22 provided on the back surface side of the semiconductor substrate 10 projected onto the upper surface of the semiconductor substrate 10, as described below in FIG. 1B. The collector region 22 has the second conductivity type. The collector region 22 of the present example is of P+ type, as one example. The transistor portion 70 includes transistors such as IGBTs.

The diode portion 80 is the region of the cathode region 82 provided on the back surface side of the semiconductor substrate 10 projected onto the upper surface of the semiconductor substrate 10, as described below in FIG. 1B. The cathode region 82 has a first conductivity type. The cathode region 82 in the present example is of the N+ type as one example. The diode portion 80 includes diodes such as free wheel diodes (FWDs) provided being adjacent to the transistor portion 70 on an upper surface of a semiconductor substrate 10.

FIG. 1A shows a surrounding region of a chip end portion, which is an edge side of the semiconductor device 100, and the other regions are omitted. For example, an edge termination structure portion is provided in the region on the negative side of the Y axis direction in the semiconductor device 100 in the present example. The edge termination structure portion reduces electric field strength on the upper surface side of the semiconductor substrate 10. The edge termination structure portion includes, for example, a guard ring, field plate or a RESURF structure, or combinations thereof. Note that although the present example describes the edge on the negative side in the Y axis direction for convenience, the same applies to other edges of the semiconductor device 100.

The semiconductor substrate 10 may be a silicon substrate, may be a silicon carbide substrate, or may be a nitride semiconductor substrate such as gallium nitride, or the like. The semiconductor substrate 10 in the present example is a silicon substrate.

The semiconductor device 100 in the present example includes a gate trench portion 40, a dummy trench portion 30, an emitter region 12, a base region 14, a contact region 15, and a well region 17, in the front surface of the semiconductor substrate 10. Also, the semiconductor device 100 of the present example includes an emitter electrode 52 and the gate metal layer 50, which are provided above the front surface of the semiconductor substrate 10.

The emitter electrode 52 is provided above the gate trench portion 40, the dummy trench portion 30, the emitter region 12, the base region 14, the contact region 15 and the well region 17. In addition, the gate metal layer 50 is provided above the gate trench portion 40 and the well region 17.

The emitter electrode 52 and the gate metal layer 50 are formed of a material including metal. For example, at least a partial region of the emitter electrode 52 is formed of aluminum, aluminum-silicon alloy or aluminum-silicon-copper alloy. At least a partial region of the gate metal layer 50 may be formed of aluminum, aluminum-silicon alloy, or aluminum-silicon-copper alloy. The emitter electrode 52 and the gate metal layer 50 may include a barrier metal formed of titanium, titanium compound, or the like under the region formed of aluminum or the like. The emitter electrode 52 and the gate metal layer 50 are provided separately from each other.

The emitter electrode 52 and the gate metal layer 50 are provided above the semiconductor substrate 10 to sandwich an interlayer dielectric film 38. The interlayer dielectric film 38 is omitted in FIG. 1A. The interlayer dielectric film 38 is provided with a contact hole 54, a contact hole 55 and a contact hole 56, which extend through the interlayer dielectric film 38.

The contact holes 55 are connected to the gate metal layer 50 and the gate conductive portion inside the gate trench portion 40 of the transistor portion 70. Inside the contact hole 55, a plug formed of tungsten or the like may be formed.

The contact hole 56 connects the emitter electrode 52 with a dummy conductive portion in a dummy trench portion 30. Inside the contact hole 56, a plug formed of tungsten or the like may be formed.

A connection portion 25 electrically connects the emitter electrode 52 or a front surface side electrode of the gate metal layer 50 or the like with the semiconductor substrate 10. In one example, the connection portion 25 is provided between the gate metal layer 50 and the gate conductive portion. The connection portion 25 is also provided between the emitter electrode 52 and the dummy conductive portion. The connection portion 25 is formed of a conductive material such as polysilicon doped with impurities. Herein, the connection portion 25 is polysilicon (N+) doped with N type impurities. The connection portion 25 is provided above the front surface of the semiconductor substrate 10 via a dielectric film such as an oxide film, or the like.

The gate trench portions 40 are arrayed in a predetermined interval along a predetermined trench array direction (the X axis direction in the present example). As one example, although the gate trench portions 40 are arrayed in a trench interval of 1.5 μm, the trench interval is not limited to this interval. The gate trench portion 40 in the present example may have two extending portions 41 extending along the trench extending direction perpendicular to the trench array direction and parallel to the front surface of the semiconductor substrate 10 (Y axis direction in the present example), and a connection portion 43 for connecting the two extending portions 41.

At least a part of the connection portion 43 is preferably formed in a curved shape. When the end portions of the two extending portions 41 of the gate trench portion 40 are connected to each other, the electric field strength at the end portions of the extending portions 41 can be reduced. At the connection portion 43 of the gate trench portion 40, the gate metal layer 50 may be connected with the gate conductive portion.

The dummy trench portion 30 in the present example is connected electrically to the emitter electrode 52, and is a trench portion set at the emitter potential. The dummy trench portions 30 are, similar to the gate trench portions 40, arrayed in a predetermined interval along a predetermined trench array direction (the X axis direction in the present example). As one example, although the dummy trench portions 30 are arrayed in a trench interval of 1.5 μm, the trench interval is not limited to this interval. In particular, the trench interval of the dummy trench portions 30 may be provided to be different from the trench interval of the gate trench portions 40. The dummy trench portion 30 in the present example has a U-shape on the front surface of the semiconductor substrate 10, similar to the gate trench portion 40. That is, the dummy trench portion 30 may have two extending portions 31 extending along the trench extending direction, and connection portions 33 to connect the two extending portions 31. The dummy trench portion 30 may be regarded as the floating potential. The dummy trench portion 30 is an example of the first trench portion adjacent to the gate trench portion 40.

The transistor portion 70 in the present example has a structure repeatedly arraying two gate trench portions 40 with the connection portion 43 and two dummy trench portions 30 without the connection portion. That is, the array ratio of the gate trench portion 40 to the dummy trench portion 30 may be set as a predetermined desired array ratio. In the transistor portion 70 in the present example, the ratio of the number of the gate trench portions 40 to the number of the dummy trench portions 30 is 1:1. The transistor portion 70 in the present example has a dummy trench portion 30 between the two extending portions 41 connected to the connection portion 43. Note that the number of the gate trench portions 40 may be the number of the extending portions 41. The number of the dummy trench portions 30 may be the number of the extending portions 31.

Note that the ratio of the gate trench portions 40 and the dummy trench portions 30 is not limited to the present example. The ratio of the gate trench portions 40 and the dummy trench portions 30 may be 2:3 or may be 2:4. With respect to the gate trench portion 40, by increasing the number of the dummy trench portions 30, the electric field strength in the mesa portion 71 can be reduced, the withstand capability of the voltage and the current of the semiconductor device 100 can be increased. Also, by adjusting the ratio of the gate trench portion 40 to the dummy trench portion 30, the gate capacitance for driving the semiconductor device 100 can be adjusted. With respect to the gate trench portion 40, by increasing the dummy trench portion 30, the gate capacitance is increased, and the saturation current is decreased. Also, in the transistor portion 70, the dummy trench portion 30 is not provided, and the so-called full-gate structure, in which all the trench portions are gate trench portions 40, is also possible. Note that the ratio of the gate trench portion 40 to the dummy trench portion 30 disclosed in the present specification may be read as the ratio of gate trench portion 40 to dummy trench. The dummy trenches include trenches that do not have channels formed in the sidewalls, such as the dummy trench portion 30 or the dummy gate trench portion 130 described below.

The well region 17 is the region, of the second conductivity type, provided on the front surface side of the semiconductor substrate 10 relative to the drift region 18, which will be described below. The well region 17 is an example of a well region provided at the edge side of the semiconductor device 100. The well region 17 is of P+ type, as one example. The well region 17 is formed within a predetermined range from the end portion of the active region on a side provided with the gate metal layer 50. A diffusion depth of the well region 17 may be deeper than a depth of the gate trench portion 40 and the dummy trench portion 30. Partial regions of the gate trench portion 40 and the dummy trench portion 30 on the gate metal layer 50 side are formed in the well region 17. The bottoms of the trench extending direction ends of the gate trench portions 40 and the dummy trench portions 30 may be covered by the well region 17.

The contact hole 54 is formed above each region of the emitter region 12 and the contact region 15 in the transistor portion 70. The emitter region 12 and contact region 15 are exposed in the contact hole 54. The contact hole 54 is not provided above the well region 17 provided at both ends of the Y axis direction. In this way, one or more contact holes 54 are formed in the interlayer dielectric film. One or more contact holes 54 may be provided to extend in the trench extending direction.

The mesa portion 71 and the mesa portion 81 may be mesa portions provided adjacent to the trench portion in the surface parallel to the front surface of the semiconductor substrate 10. The mesa portion may be a portion of the semiconductor substrate 10 sandwiched by two trench portions that are adjacent to each other, and may be a portion from the front surface of the semiconductor substrate 10 down to the depth of the bottom portion, which is the deepest portion, of each trench portion. The extending portions of each trench portion may be regarded as one trench portion. In other words, the region sandwiched between two extending portions may be regarded as a mesa portion.

The mesa portion 71 is provided adjacent to at least one of the dummy trench portion 30 or the gate trench portion 40 in the transistor portion 70. The mesa portion 71 has the well region 17, the emitter region 12, the base region 14, and the contact region 15, in the front surface of the semiconductor substrate 10.

On the other hand, the mesa portion 81 is provided adjacent to the dummy trench portion 30 in the diode portion 80. The trench portion in the mesa portion 81 may be set to the emitter potential connected electrically to the emitter electrode 52 through the contact hole 56. That is, the trench portion provided in the diode portion 80 may be the dummy trench portion 30.

The mesa portion 81 has a well region 17 and a base region 14 on the front surface of the semiconductor substrate 10. Note that the emitter electrode 52 is arranged on the upper surface of the mesa portion 81. That is, the metal layer of the emitter electrode 52 may function as an anode electrode in the diode portion 80.

The base region 14 is the region of the second conductivity type provided on the front surface side of the semiconductor substrate 10 in the transistor portion 70. The base region 14 is of the P− type, as one example. The base region 14 may be provided at both end portions of the mesa portion 71 in the Y axis direction, in the front surface 21 of the semiconductor substrate 10. Note that FIG. 1A illustrates only one end portion in the Y axis direction of the base region 14.

The emitter region 12 is a region of the first conductivity type which has a higher doping concentration than the drift region 18 described below in FIG. 1B. The emitter region 12 in the present example is of the N+ type as one example. For example, the dopant of the emitter region 12 is phosphorus (P) or arsenic (As) or the like. The emitter region 12 is provided in contact with the gate trench portion 40 in the front surface of the mesa portion 71. The emitter region 12 may be provided to extend in the X axis direction from one of two trench portions sandwiching the mesa portion 71 to the other of the two trench portions. The emitter region 12 is also provided below the contact hole 54.

The emitter region 12 may extend to the dummy trench portion 30 and be in contact with the dummy trench portion 30. Note that the emitter region 12 may terminate without reaching the dummy trench portion 30 and may not be in contact with the dummy trench portion 30. The emitter region 12 in the present example is not in contact with the dummy trench portion 30.

The contact region 15 is a region of the second conductivity type having a higher doping concentration than that of the base region 14. The contact region 15 in the present example is of the P+ type, as one example. One example of the dopant of the contact region 15 is boron (B). The contact region 15 in the present example is provided in the front surface 21 of the mesa portion 71. The contact region 15 may be provided in the X axis direction from one of two trench portions sandwiching the mesa portion 71 to the other of the two trench portions. Note that the contact region 15 may be spaced apart from the gate trench portion 40 below the emitter region 12 in the portion where the emitter region 12 is in contact with the gate trench portion 40.

The contact region 15 may be or may not be in contact with the gate trench portion 40. Moreover, the contact region 15 may be or may not be in contact with the dummy trench portion 30. In the present example, the contact region 15 is in contact with the dummy trench portion 30 and the gate trench portion 40. The contact region 15 is also provided below the contact hole 54. Note that the contact region 15 may be provided in the mesa portion 81.

Figure 1B:
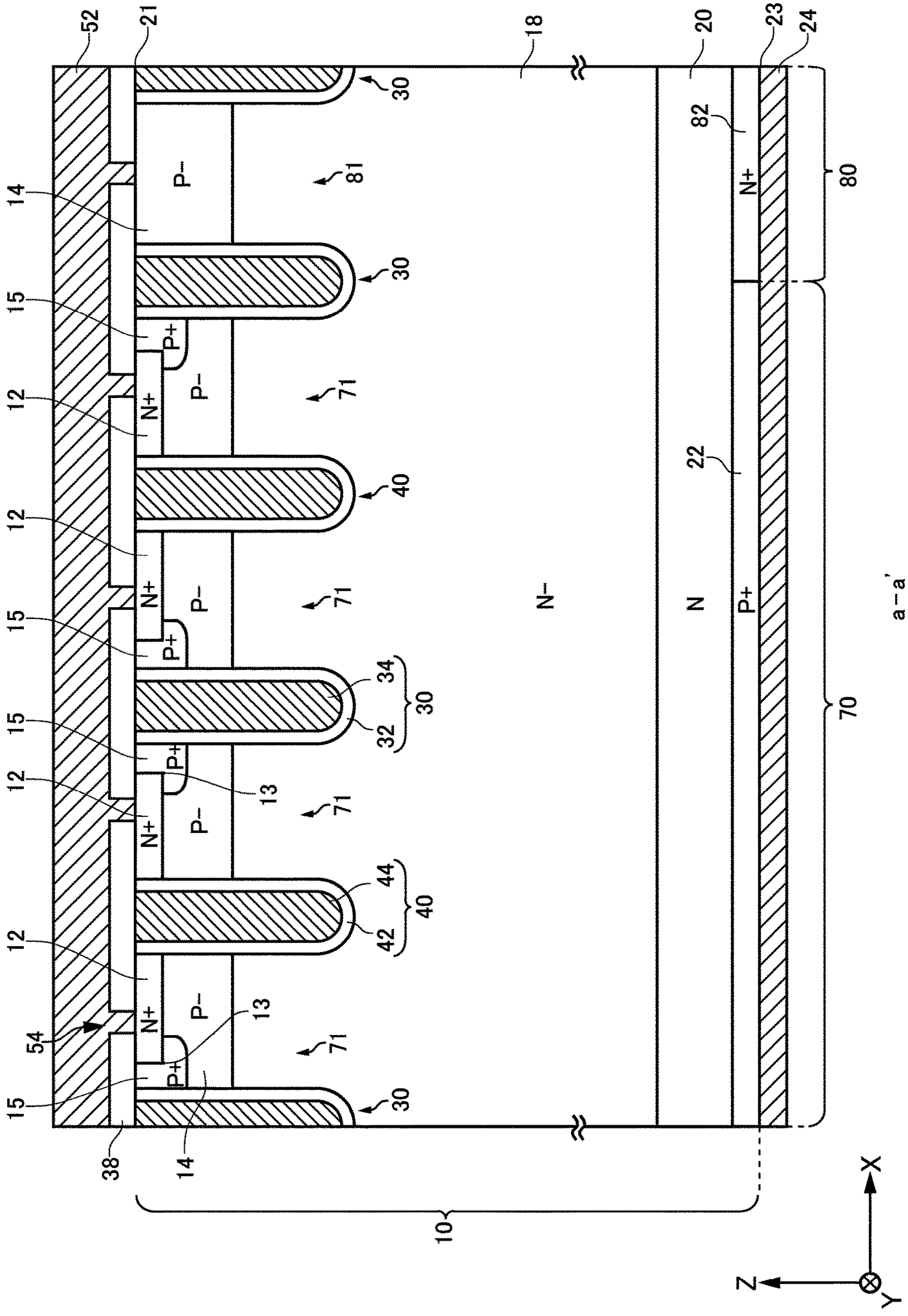
FIG. 1B illustrates an example of a-a' cross sectional view in FIG. 1A.

FIG. 1B illustrates an example of the a-a' cross sectional view in FIG. 1A. The cross section a-a' is the XZ plane passing through the emitter region 12 in the transistor portion 70, from the transistor portion 70 to the diode portion 80. In the cross section a-a', the semiconductor device 100 of the present example has the semiconductor substrate 10, the interlayer dielectric film 38, the emitter electrode 52, and the collector electrode 24. The emitter electrode 52 is formed above the semiconductor substrate 10 and the interlayer dielectric film 38.

The drift region 18 is a region of the first conductivity type provided in the semiconductor substrate 10. The drift region 18 in the present example is of the N− type, as one example. The drift region 18 may be a remaining region where another doping region is not formed in the semiconductor substrate 10. In other words, the doping concentration of the drift region 18 may be a doping concentration of the semiconductor substrate 10.

The buffer region 20 is a region of the first conductivity type provided below the drift region 18. The buffer region 20 in the present example is of the N type, as one example. The doping concentration of the buffer region 20 is higher than the doping concentration of the drift region 18. The buffer region 20 may function as a field stop layer which prevents a depletion layer spreading from the lower surface side of the base region 14 from reaching the collector region 22 of the second conductivity type and the cathode region 82 of the first conductivity type.

The collector region 22 is provided below the buffer region 20 in the transistor portion 70. The collector electrode 24 is formed on the back surface 23 of the semiconductor substrate 10. The collector electrode 24 is formed of a conductive material such as metal.

The base region 14 is a region of the second conductivity type provided above the drift region 18 in the mesa portion 71 and the mesa portion 81. The base region 14 is provided in contact with the gate trench portion 40. The base region 14 may be provided in contact with the dummy trench portion 30.

The emitter region 12 is provided between the base region 14 and the front surface 21 in the mesa portion 71. The emitter region 12 is provided in contact with the gate trench portion 40. The emitter region 12 may be or may not be in contact with the dummy trench portion 30.

One or more gate trench portions 40 and one or more dummy trench portions 30 are provided at the front surface 21. Each trench portion is provided from the front surface 21 to the drift region 18. In regions being provided with at least any of the emitter region 12, the base region 14 and the contact region 15, each trench portion penetrates these regions and reaches the drift region 18. The configuration of the trench portion penetrating the doping region is not limited to the one manufactured in the order of forming the doping region and then forming the trench portion. A case where a doping region is formed between the trench portions after the trench portion is formed is also included in a case where the trench portion penetrating the doping region.

The gate trench portion 40 has a gate trench, a gate dielectric film 42 and a gate conductive portion 44 that are formed in the front surface 21. The gate dielectric film 42 is formed to cover an inner wall of the gate trench. The gate dielectric film 42 may be formed by oxidizing or nitriding the semiconductor in the inner wall of the gate trench. The gate dielectric film 42 is formed in the interior of the gate trench, and the gate conductive portion 44 is formed inside the gate dielectric film 42. The gate dielectric film 42 insulates the gate conductive portion 44 from the semiconductor substrate 10. The gate conductive portion 44 is formed of a conductive material such as polysilicon. The gate trench portion 40 is covered by the interlayer dielectric film 38 in the front surface 21. The potential at the gate metal layer such as IGBT is applied to the gate conductive portion 44.

The gate conductive portion 44 includes a region opposing the adjacent base region 14 on the mesa portion 71 side by sandwiching the gate dielectric film 42, in the depth direction of the semiconductor substrate 10. When a predetermined voltage is applied to the gate conductive portion 44, a channel as an inversion layer of electrons is formed in the interfacial surface layer of the base region 14 in contact with the gate trench.

The dummy trench portion 30 may have the same structure as that of the gate trench portion 40. The dummy trench portion 30 has a dummy trench, a dummy dielectric film 32 and a dummy conductive portion 34 that are formed on the front surface 21 side. The dummy dielectric film 32 is formed covering the inner walls of the dummy trench. The dummy conductive portion 34 is formed in the interior of the dummy trench and the dummy conductive portion 34 is formed inside the dummy dielectric film 32. The dummy dielectric film 32 insulates the dummy conductive portion 34 from the semiconductor substrate 10. The dummy trench portion 30 is covered by the interlayer dielectric film 38 in the front surface 21. The potential at the emitter electrode such as IGBT is applied to the dummy conductive portion 34. The dummy conductive portion 34 may be a floating potential.

The interlayer dielectric film 38 is provided in the front surface 21. The emitter electrode 52 is provided above the interlayer dielectric film 38. In the interlayer dielectric film 38, one or more contact holes 54 are provided for electrically connecting the emitter electrode 52 with the semiconductor substrate 10. The contact hole 55 and the contact hole 56 may similarly be provided to penetrate the interlayer dielectric film 38.

The lower end 13 is the lower end on the dummy trench portion 30 side of the emitter region 12 in the mesa portion 71. When the emitter region 12 reaches the dummy trench portion 30, the lower end 13 is in contact with the dummy trench portion 30.

At least a part of the contact region 15 is provided below the lower end 13 in the mesa portion 71. That is, the contact region 15 is provided deeper than the emitter region 12, and provided to partially overlap with the emitter region 12. The contact region 15 in the present example is provided to extend from the dummy trench portion 30 to the bottom of the lower end 13 of the emitter region 12 in the trench array direction. This makes it more difficult for holes below the emitter region 12 to be extracted directly through the emitter region 12 and easier for hole current to be extracted from the contact region 15. This makes it difficult for NPNP-type parasitic thyristors from the emitter region 12 to the collector region 22 to turn on, thereby able to suppress latch-up of the semiconductor device 100.

In the cross section of the present example, the contact region 15 is spaced apart from the gate trench portion 40 at the mesa portion 71. This allows the semiconductor device 100 to operate stably without the contact region 15 interfering with the formation of the inversion layer on the side surface of the gate trench portion 40.

The contact region 15 in the present example is provided to span both sides of the dummy trench portion 30 in the X axis direction. In the present example, the process for fabricating the contact region 15 allows a resist to be provided on the semiconductor substrate 10 and the contact region 15, which spans the region where the trench portion is to be provided, can be installed by ion implantation. The dummy trench portion 30 can be set to perform etching on the semiconductor substrate 10 after providing the contact region 15.

In recent years, for the purpose of miniaturization of semiconductor devices 100 and so on, the spacing between mesa portions 71 has been shortened, so-called process pitch miniaturization. For example, when diffusion regions are provided by ion implantation in a silicon semiconductor substrate 10, dopants tend to diffuse within a certain range. The structure of the contact region 15 in the present example facilitates the fabrication of a contact region 15 that extends to the bottom of the lower end 13 of the emitter region 12 and is spaced apart from the gate trench portion 40, even when the process pitch is miniaturized. This can provide semiconductor devices 100 with high latch-up withstand capability without significantly affecting electrical characteristics. However, the latch-up suppression effect can be realized if the contact region 15 is provided so that it is connected in the trench extending direction, and the contact region 15 is not limited to the form in which it contacts the dummy trench portion 30.

In the diode portion 80, the buffer region 20 is stacked above the cathode region 82, and the drift region 18 is stacked above the buffer region 20. In the mesa portion 81, the base region 14 is stacked above the drift region 18, and a PN junction is formed between the base region 14 and the drift region 18. The base region 14 is connected electrically to the emitter electrode 52 via the contact holes 54.

Figure 1C:
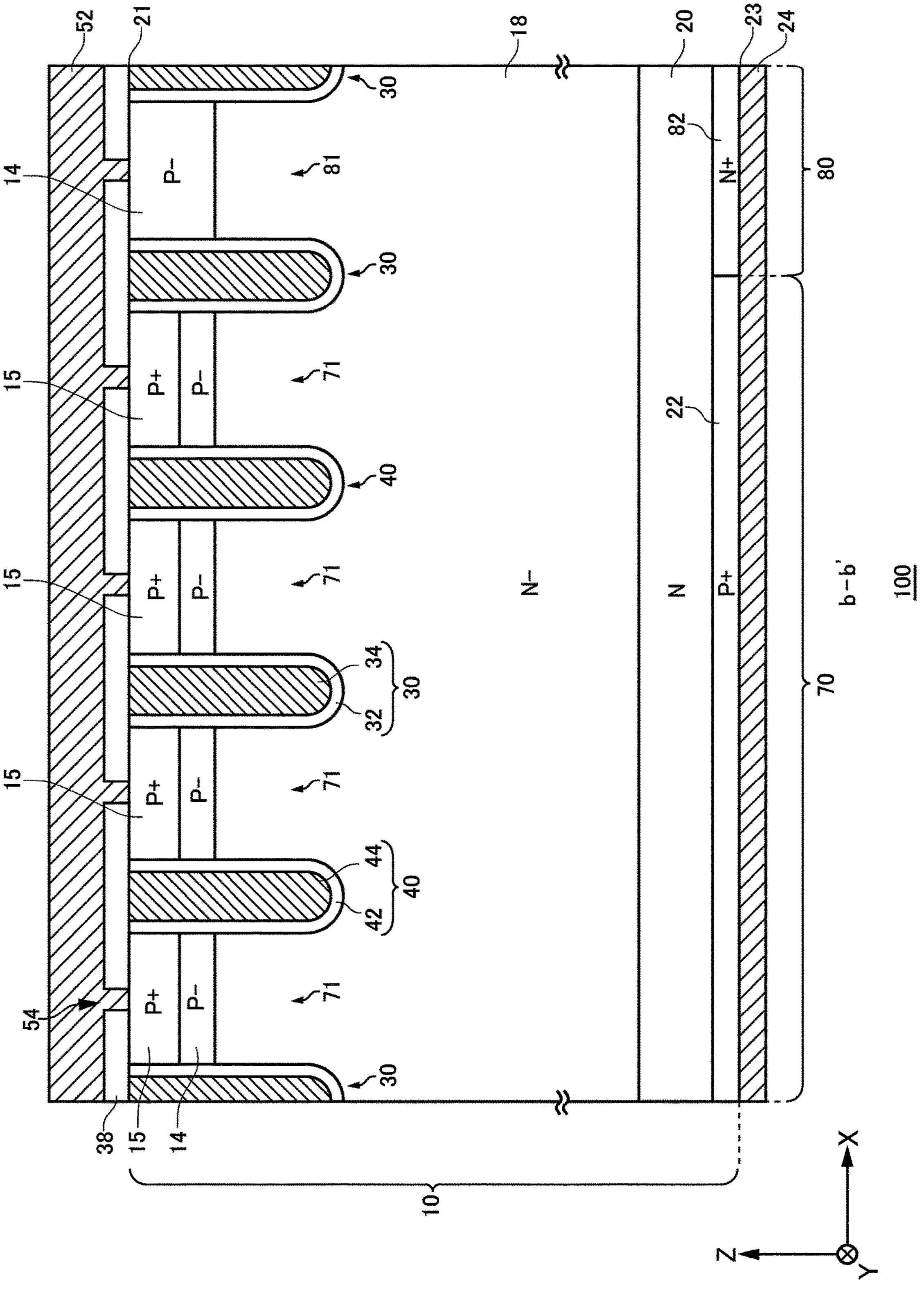
FIG. 1C illustrates an example of b-b' cross sectional view in FIG. 1A.

FIG. 1C illustrates an example of the b-b' cross sectional view in FIG. 1A. The cross section b-b' is the XZ plane not passing through the emitter region 12 in the transistor portion 70. In the present example, the mesa portion 71 in the transistor portion 70 has a base region 14 and a contact region 15 above the drift region 18. The mesa portion 81 has a structure similar to the example in the FIG. 1B in the diode portion 80.

The contact region 15 extends from the gate trench portion 40 to the dummy trench portion 30. The contact holes 54 are provided above the contact region 15. The hole is extracted from the contact region 15 via the contact holes 54.

When the contact region 15 provided below the emitter region 12 and the contact region 15 in the cross section in the present example are provided by the same process, the depth of the contact regions 15 are provided to be the same depth. In this case, the contact region 15 is deeper than the emitter region 12. Note that the contact region 15 may be provided with different depths in other regions below the emitter region 12.

Figure 2:
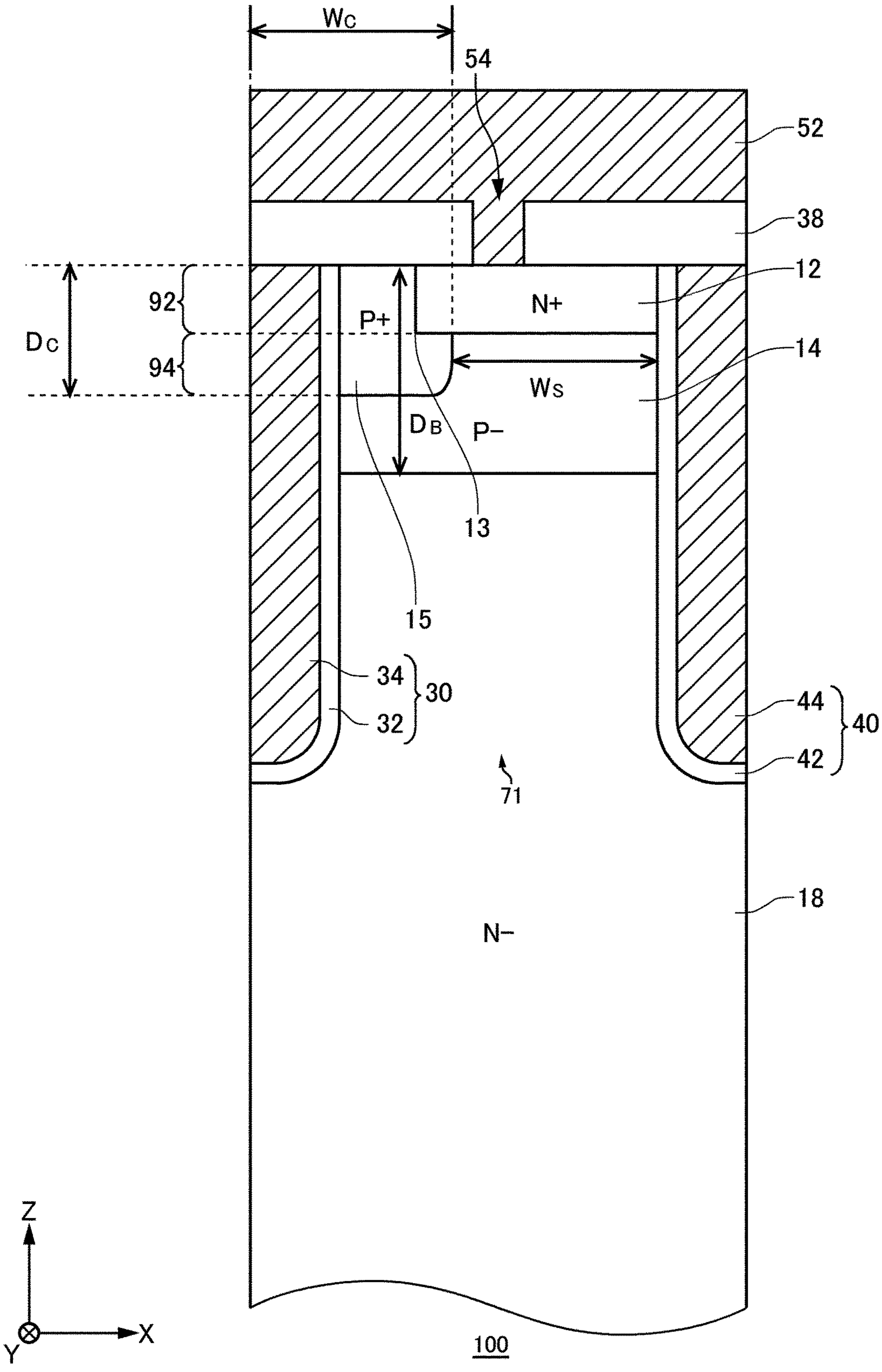
FIG. 2 illustrates an example of an enlarged cross sectional view of a mesa portion 71.

FIG. 2 illustrates an example of an enlarged cross sectional view of the mesa portion 71. The present example illustrates the XZ plane passing through the emitter region 12 in the transistor portion 70.

The emitter region 12 extends from the gate trench portion 40 beyond the contact holes 54 to the dummy trench portion 30 in the trench array direction. This facilitates current conduction from the emitter region 12 through the contact hole 54, resulting in good electrical characteristics of the semiconductor device 100. The emitter region 12 in the present example extends from the gate trench portion 40 to the dummy trench portion 30 in the trench array direction and terminates without reaching the dummy trench portion 30. However, the emitter region 12 may be provided to extend from the gate trench portion 40 to the dummy trench portion 30 in the trench array direction.

The contact region 15 is provided on the front surface 21 of the semiconductor substrate 10 on the sidewall of the dummy trench portion 30. The contact region 15 includes a surface region 92 and a lower region 94.

The surface region 92 is a region at the same depth with the emitter region 12 in the semiconductor substrate 10. The depth of the surface region 92 is 0.5 μm as one example. Note that the depth of the surface region 92 may be provided at a different depth. The emitter region 12 extends from the gate trench portion 40 to the dummy trench portion 30, and when reaching the dummy trench portion 30, the surface region 92 is not provided in the cross section where the emitter region 12 is exposed from the front surface 21 if the semiconductor substrate 10. The impurity concentration of the surface region 92 may be from a range of $5E19/cm^3$ to $2E20/cm^3$.

The lower region 94 is provided in a region deeper than the emitter region 12 in the semiconductor substrate 10. The lower region 94 extends to the gate trench portion 40 side beyond the lower end 13 of the gate trench portion 40 side of the emitter region 12 extending from the gate trench portion 40 to the dummy trench portion 30. The impurity concentration of the lower region 94 may be in a range from $1E19/cm^3$ to $1E20/cm^3$.

The width Wc is a width of the contact region 15 in the trench array direction. The width Wc is a width measured from the center of the dummy trench portion 30 to the lower end of the dummy trench portion 30 side of the emitter region 12. That is, the width Wc corresponds to the maximum reachable position on the gate trench portion 40 side of the lower region 94 measured from the center of the dummy trench portion 30. The width Wc may be 1.2 μm or less, and may be 1.1 μm or less. Herein, the width of the surface region 92 in the trench array direction may be in a range from 15% to 40% for the distance between the adjacent trenches. The width of the lower region 94 in the trench array direction may be in a range from 30% to 70% for the distance between the adjacent trenches. The width in the trench array direction of the portion where the lower region 94 overlaps with the emitter region 12 may be in a range from 0% to 30%, further preferably, from 10% to 20% for the distance between the adjacent trenches.

The thickness Dc is the thickness of the contact region 15 in the depth direction of the semiconductor substrate 10. The thickness Dc is thicker than the depth of the lower end 13 of the emitter region 12 and less than the depth of the base region 14. For example, the thickness Dc is from 0.5 μm to 2.0 μm. The thickness of the surface region 92 may be in a range from 0.3 μm to 0.8 μm. The thickness of the lower region 94 may be in a range from 0.3 μm to 1.1 μm.

The width Ws is the distance between the contact region 15 and the gate trench portion 40 in the trench array direction. The width Ws may be provided to be capable to form the channel in the end portion of the gate trench portion 40. That is, the width Ws corresponds to the separated distance between the contact region 15 and the gate trench portion 40. In an example, the width Ws is 0.6 μm or more. The width Ws in the trench array direction may be in a range from 30% to 70% for the distance between the adjacent trenches.

Figure 3:
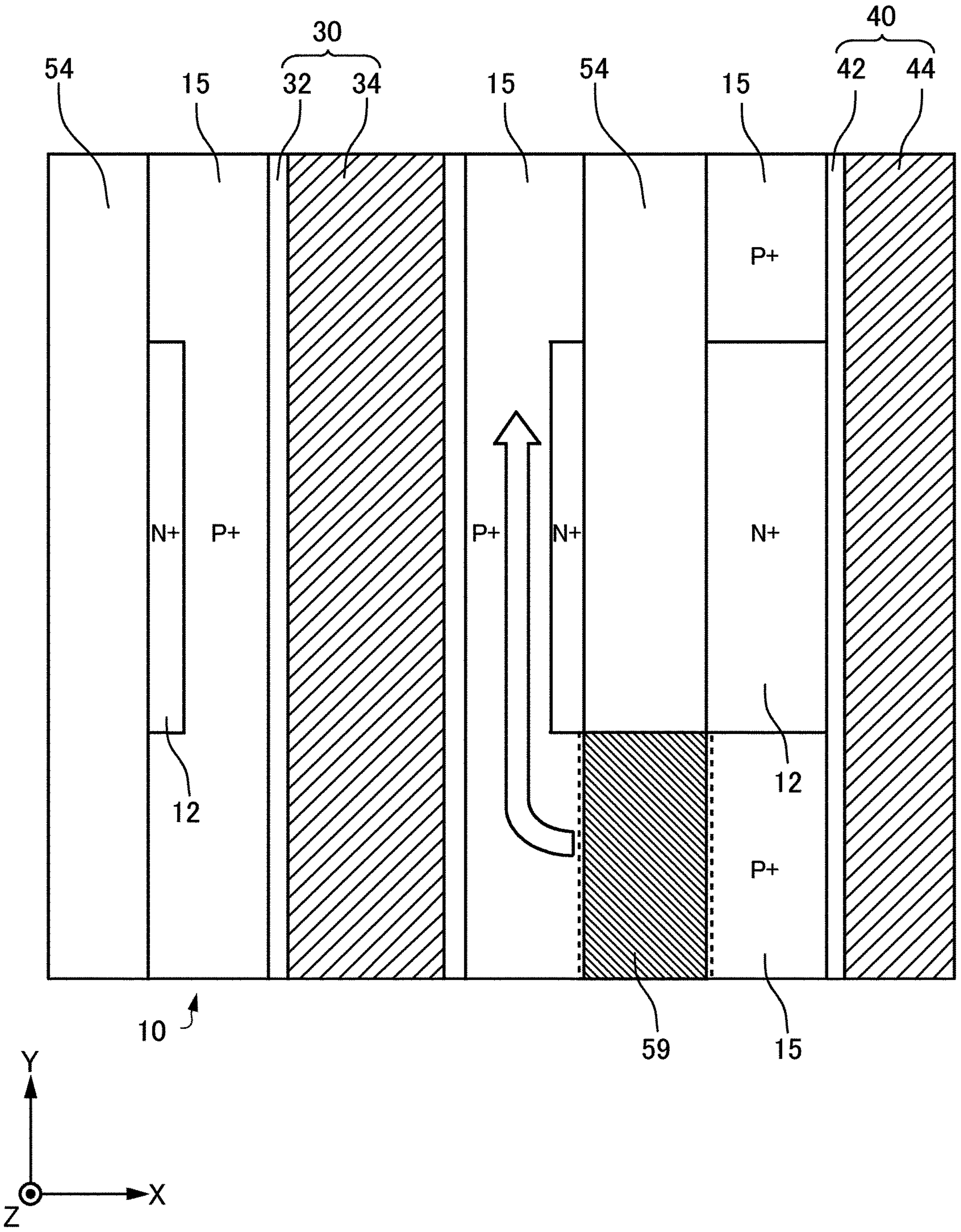
FIG. 3 illustrates an example of a top view of the semiconductor device 100 including an unopened portion of a contact hole 54.

FIG. 3 illustrates an example of a top view of the semiconductor device 100 including an unopened portion of a contact hole 54. FIG. 3 is an example of an enlarged view of the upper surface of the semiconductor device 100.

The disconnected region 59 is a region where the emitter electrode 52 is not connected electrically to the contact region 15 in the front surface 21. For example, the disconnected region 59 is an unopened region where the contact holes 54 is not formed in the interlayer dielectric film 38 due to oxide film etching defects caused by particles or foreign matter or the like. Also, the disconnected region 59 may be a region where the contact region 15 of the front surface 21 is not formed due to resist remaining or the like.

In the present example, the hole current that would have been extracted in the disconnected region 59 flows through the contact region 15 and is extracted via the contact hole 54 above the other neighboring contact region 15. That is, the hole current does not flow through the base region 14 below the emitter region 12, but through the contact region 15, which has lower resistance to holes than the base region 14, thus can suppress latch-up. This suppresses switching breakdowns caused by process defects. Accordingly, a semiconductor device 100 with a redundant device structure that is resistant to process defects is provided.

Figure 4A:
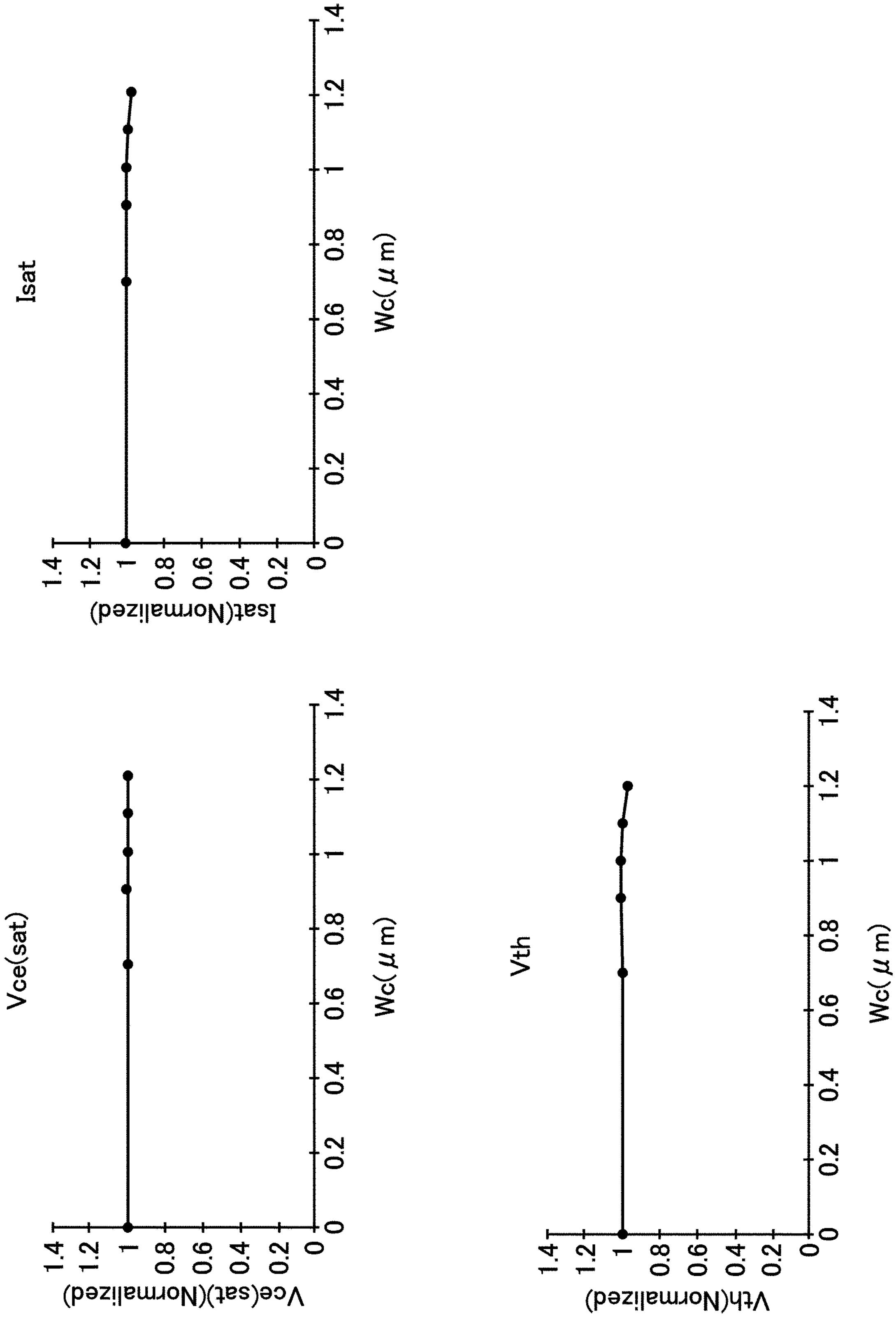
FIG. 4A illustrates an example of a simulation result of static characteristics of the semiconductor device 100.

FIG. 4A illustrates an example of the simulation result of the static characteristics of the semiconductor device 100. In the present example, the variation in the static characteristics for the width Wc of the contact region 15 is illustrated. In the present example, the case where the width of the mesa portion 71 between the dummy trench portion 30 and the gate trench portion 40 is 1.5 μm is illustrated as an example. Note that in order to show the qualitative nature of the simulation results, the numerical values on the vertical axis in the present example are scaled to normalized values, where the initial value corresponding to the contact region width Wc=0 is normalized to 1. The units that each normalized value has may be an appropriate unit that has a dimension according to each physical quantity.

The relationship between the saturation voltage Vce between collector and emitter when the semiconductor device 100 is driven, the relationship between the saturation current between collector and emitter when the semiconductor device 100 is driven, and the relationship between the threshold voltage Vth of the semiconductor device 100 for the width Wc is shown. When the width Wc is 1.2 μm or less, the effect of the contact region 15 on the channel formation in the base region 14 is small. Accordingly, when the width Wc is in this range, the effect on all these static characteristic values can be maintained in a small range.

Figure 4B:
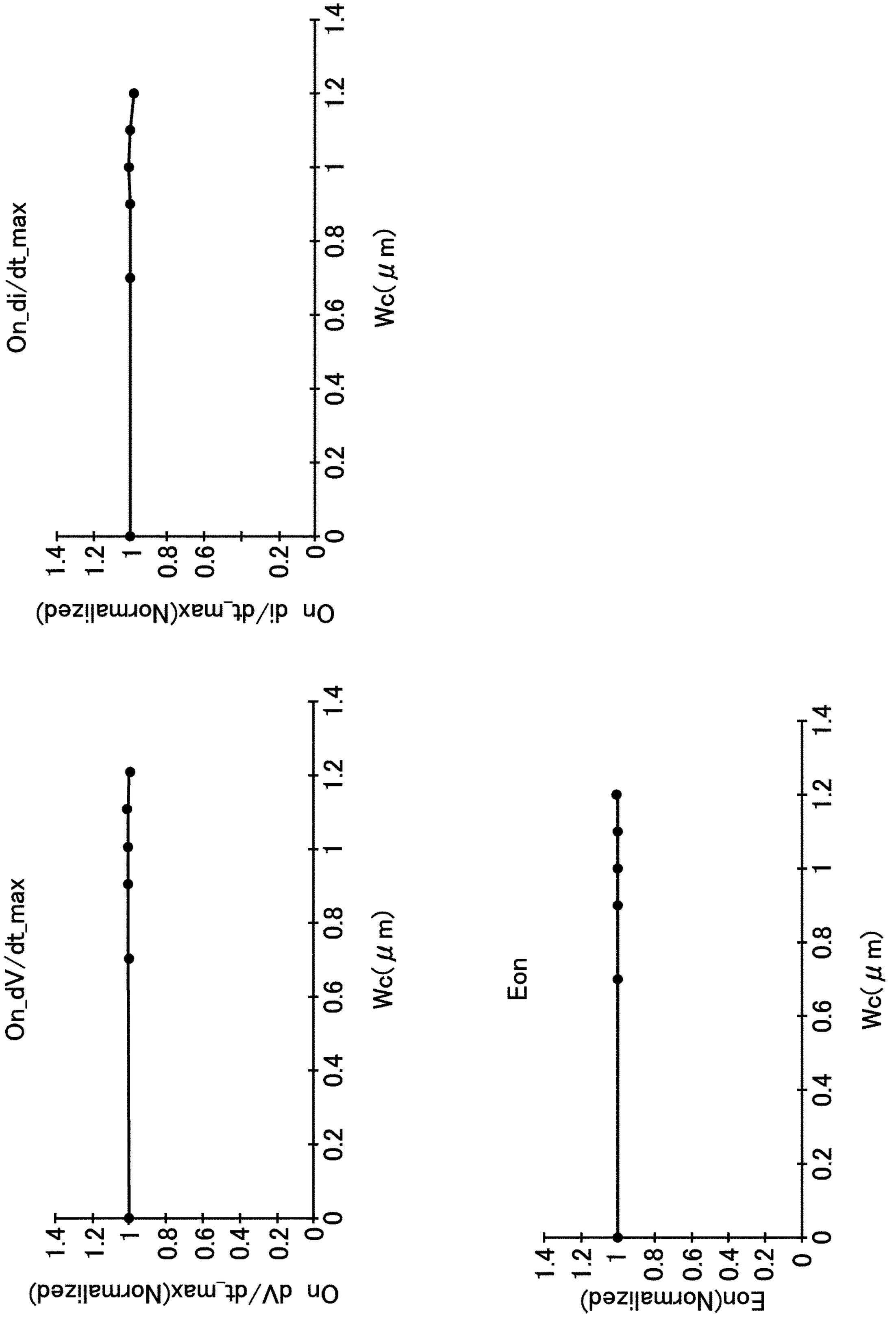
FIG. 4B illustrates an example of a simulation result of ON characteristics of the semiconductor device 100.

FIG. 4B illustrates an example of an simulation result of ON characteristics of the semiconductor device 100. In the present example, the variation of the ON characteristics for the width Wc of the contact region 15 is illustrated. Note that with respect to the numerical value of the vertical axis in the present example, are scaled to the normalized values.

The relationship of the maximum time variation dV/dt_max (Normalized) of the voltage Vce between the collector and emitter when the semiconductor device 100 is driven, the relationship of the maximum time variation di/dt_max (Normalized) of the current between the collector and emitter when the semiconductor device 100 is driven, and the relationship of the turn-on loss Eon (Normalized) of the semiconductor device 100, with respect to Wc, are illustrated. When the width Wc is 1.2 μm or less, the effect of the contact region 15 applied to the formation of the channel of the base region 14 is small. Accordingly, when the width Wc is in this range, the effect to all the ON characteristic value can be maintained in a small range.

Figure 4C:
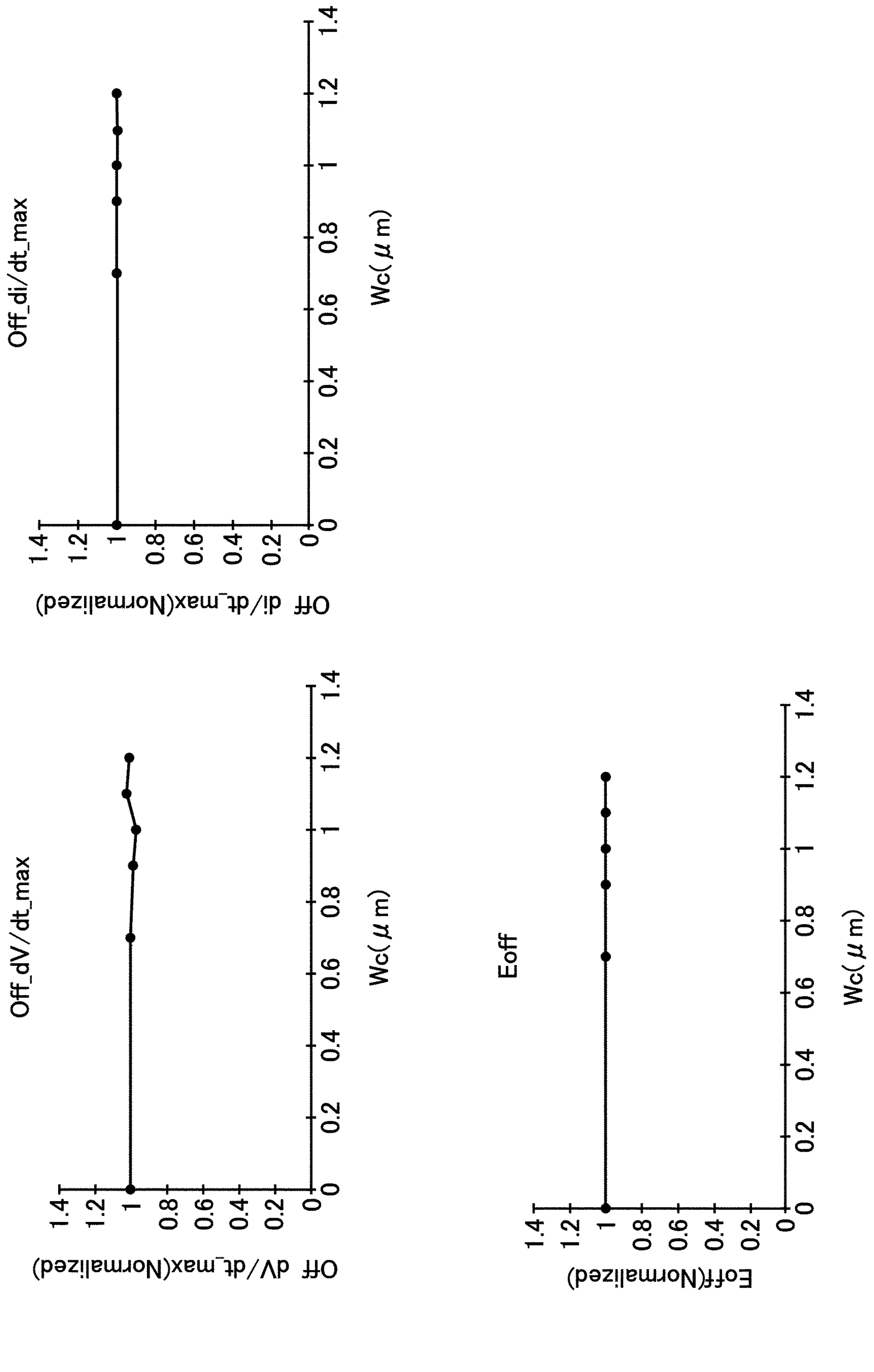
FIG. 4C illustrates an example of a simulation result of OFF characteristics of the semiconductor device 100.

FIG. 4C illustrates an example of the simulation result of OFF characteristics of the semiconductor device 100. In the present example, the variation of the OFF characteristics for the width Wc of the contact region 15 is illustrated. Note that with respect to the numerical value of the vertical axis in the present example, are scaled to the normalized values.

The relationship of the maximum time variation dV/dt_max (Normalized) of the voltage Vce between the collector and emitter when the semiconductor device 100 is driven, the relationship of the maximum time variation di/dt_max (Normalized) of the current between the collector and emitter when the semiconductor device 100 is driven, and the relationship of the turn-off loss Eoff (Normalized) of the semiconductor device 100, with respect to Wc, are illustrated. When the width Wc is 1.2 μm or less, the effect of the contact region 15 on the channel formation in the base region 14 is small. Accordingly, when the width Wc is in this range, the effect to all the OFF characteristic value can be maintained in a small range.

As shown in the simulation results in FIG. 4B and FIG. 4C, the semiconductor device 100 in the present example applies no effect to the electrical characteristics by the structure of the contact region 15. Accordingly, as shown in the simulation results in FIG. 4A to FIG. 4C, the semiconductor device 100 in the present example applies no significant effect to the electrical characteristics in both of the static characteristics and dynamic characteristics. The semiconductor device 100 in the present example improves the latch-up withstand capability without applying the variation in the electrical characteristics.

Figure 5A:
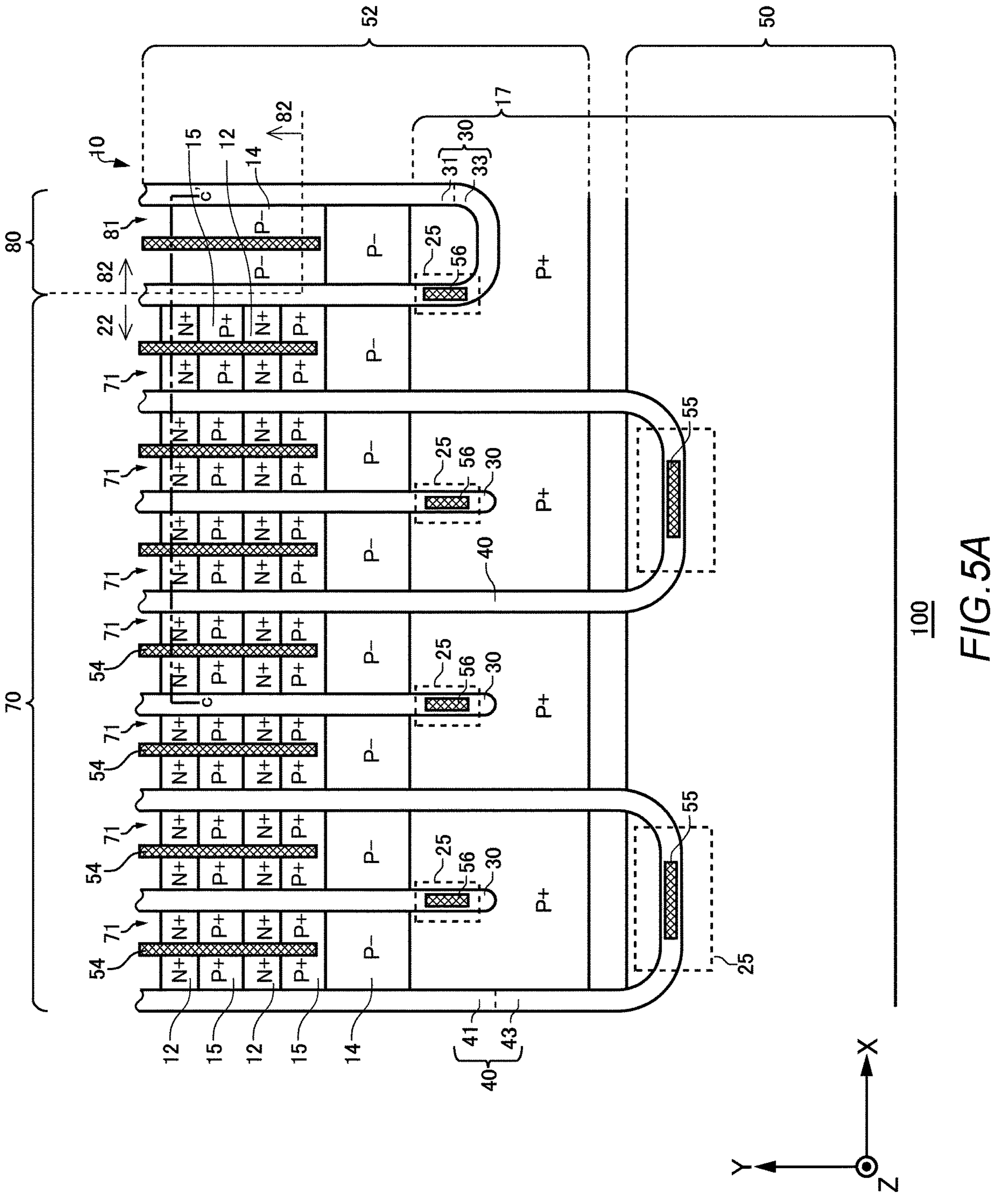
FIG. 5A illustrates an example of a top view of the semiconductor device 100.

FIG. 5A illustrates an example of the top view of the semiconductor device 100. In the present example, the emitter region 12 is different from FIG. 1A in a point of being provided to be in contact with the dummy trench portion 30. In the present example, the point different from FIG. 1A is described in particular.

The emitter region 12 in the present example extends from the gate trench portion 40 to the dummy trench portion 30 in the trench array direction. The emitter region 12 and the contact region 15 are provided to be in contact with each of the gate trench portion 40 and the dummy trench portion 30 alternately with respect to the trench extending direction in the front surface 21 of the semiconductor substrate 10.

Figure 5B:
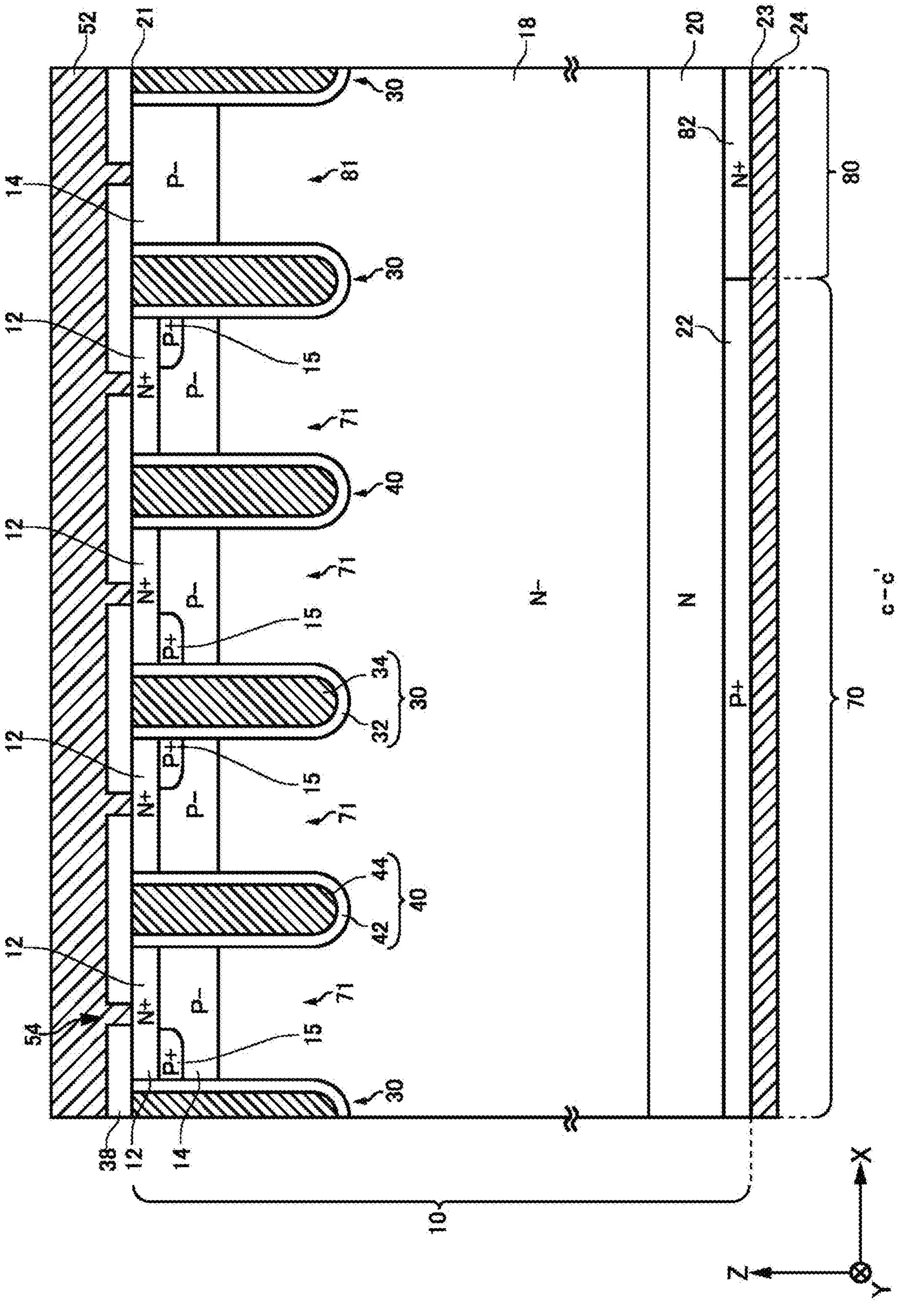
FIG. 5B illustrates an example of c-c' cross sectional view in FIG. 5A.

FIG. 5B illustrates an example of the c-c' cross sectional view in FIG. 5A. The cross section c-c' is the XZ plane passing through the emitter region 12 in the transistor portion 70, from the transistor portion 70 to the diode portion 80. Note that the XZ cross section from the transistor portion 70 to the diode portion 80, passing through the contact region 15 in the transistor portion 70, is the same as the FIG. 1C.

In the present example, the surface region 92 of the contact region 15 is not provided in the cross section c-c'. The contact region 15 in the present example has a structure similar to the example of FIG. 1B in the lower region 94. That is, at least a part of the contact region 15 is provided below the lower end 13 in the mesa portion 71. This can make it difficult for holes below the emitter region 12 to be extracted directly through the emitter region 12, and hole current can be extracted from the contact region 15 to suppress latch-up.

Figure 6A:
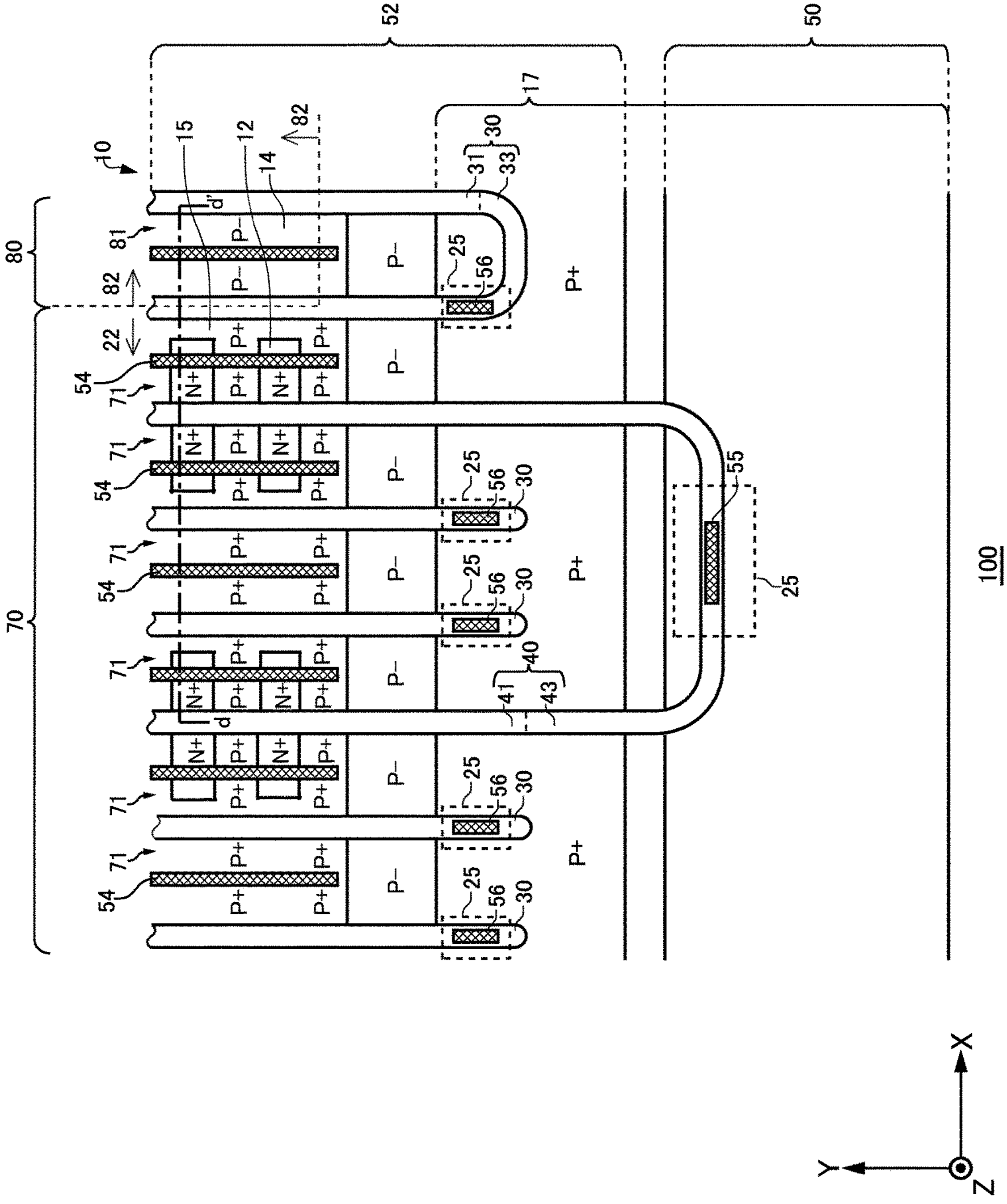
FIG. 6A illustrates an example of a top view of the semiconductor device 100.
Figure 6B:
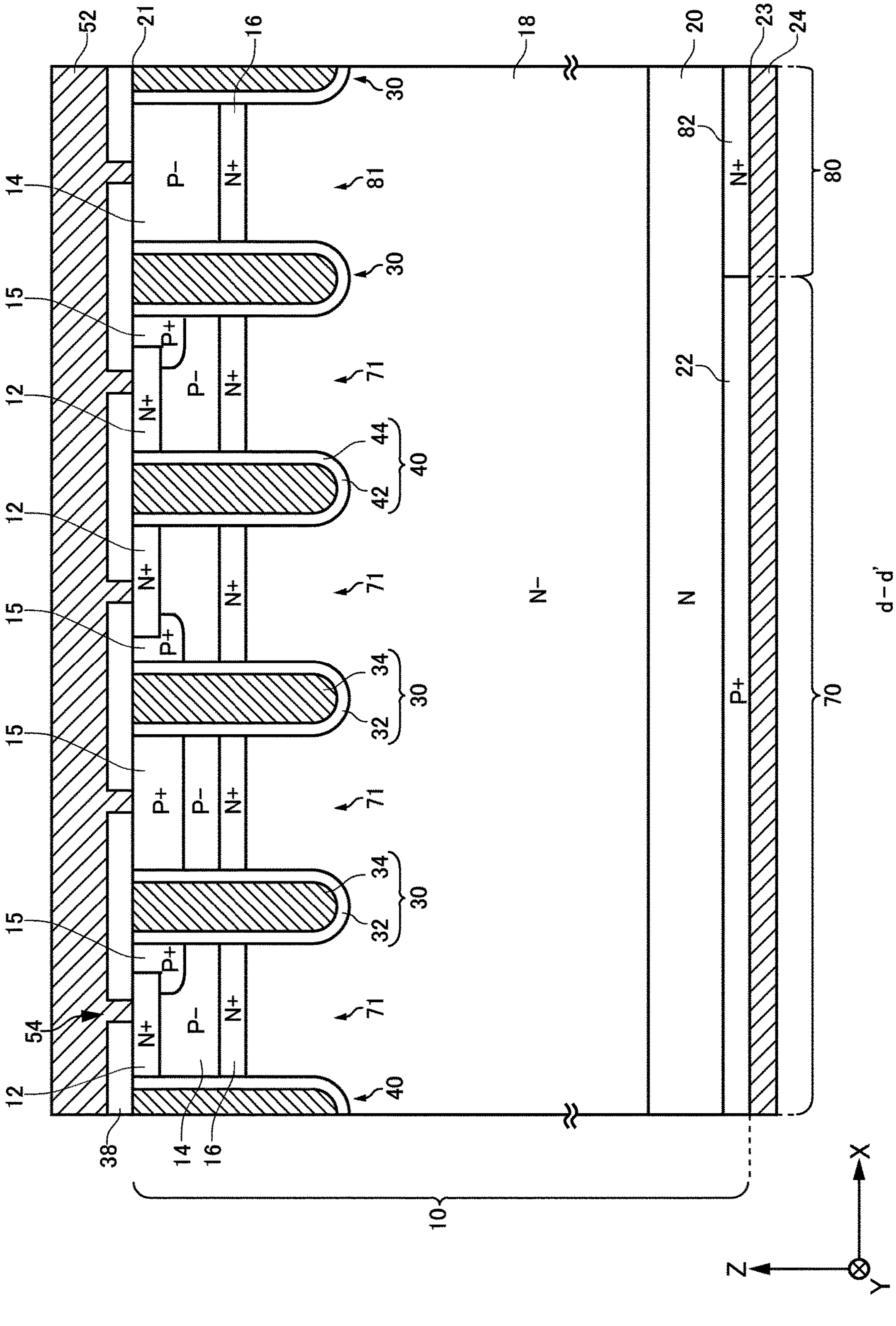
FIG. 6B illustrates an example of d-d' cross sectional view in FIG. 6A.

FIG. 6A illustrates an example of the top view of the semiconductor device 100. In the present example, the ratio of the number of the gate trench portions 40 to the number of the dummy trench portions 30 is 1:2. The semiconductor device 100 in the present example can improve the withstand capability to defects by increasing the ratio of the 30 dummy trench portions.

In the present example, in the transistor portion 70 of the front surface of the semiconductor substrate 10, the gate trench portion 40 with a U-shaped structure and two dummy trench portions 30 with an I-shaped structure are arrayed. However, the structures of gate trench portion 40 and dummy trench portion 30 are not limited to these as long as the array ratio of gate trench portion 40 and dummy trench portion 30 can be maintained at 1:2. As one example, the dummy trench portion 30 may have a U-shaped structure and the region within the dummy trench portion may be a floating region.

In addition, the accumulation region 16 is provided in contact with the gate trench portion 40. The accumulation region 16 may be or may not be in contact with the dummy trench portion 30. The doping concentration of the accumulation region 16 is higher than the doping concentration of the drift region 18. The dose amount of ion implantation to the accumulation region 16 may be 1E12 $cm^{-2}$ or more and 1E13 $cm^{-2}$ or less. In addition, the dose amount of ion implantation to the accumulation region 16 may also be 3E12 $cm^{-2}$ or more and 6E12 $cm^{-2}$ or less. By providing the accumulation region 16 the carrier injection enhancement effect (Injection Enhancement effect) can be improved and the ON voltage of the transistor portion can be decreased 70. Note that E means a power of 10, for example 1E12 $cm^{-2}$ means $1\times10^{12}$ $cm^{-2}$.

The accumulation region 16 is a region of the first conductivity type provided between the base region 14 and the drift region 18. The accumulation region 16 in the present example is of the N+ type, as one example. The accumulation region 16 is provided in the transistor portion 70 and the diode portion 80. This allows the semiconductor device 100 to avoid mask misalignment in the accumulation region 16.

In addition, the accumulation region 16 is provided in contact with the gate trench portion 40. The accumulation region 16 may be or may not be in contact with the dummy trench portion 30. The doping concentration of the accumulation region 16 is higher than the doping concentration of the drift region 18. The dose amount of ion implantation to the accumulation region 16 may be 1E12 $cm^{-2}$ or more and 1E13 $cm^{-2}$ or less. In addition, the dose amount of ion implantation to the accumulation region 16 may also be 3E12 $cm^{-2}$ or more and 6E12 $cm^{-2}$ or less. By providing the accumulation region 16 the carrier injection enhancement effect (Injection Enhancement effect) can be improved and the ON voltage of the transistor portion can be decreased 70. Note that E means a power of 10, for example 1E12 $cm^{-2}$, 1E12 $cm^{-2}$ means $1\times10^{12}$ $cm^{-2}$.

In the present example, the contact region 15 is below the emitter region 12, and electrically connects the adjacent contact regions 15 in between. The semiconductor device 100 can suppress latch-up due to the structure of the contact region 15, regardless of the presence or absence of the accumulation region 16 and the array ratio of the gate trench portion 40 and the dummy trench portion 30.

Figure 7A:
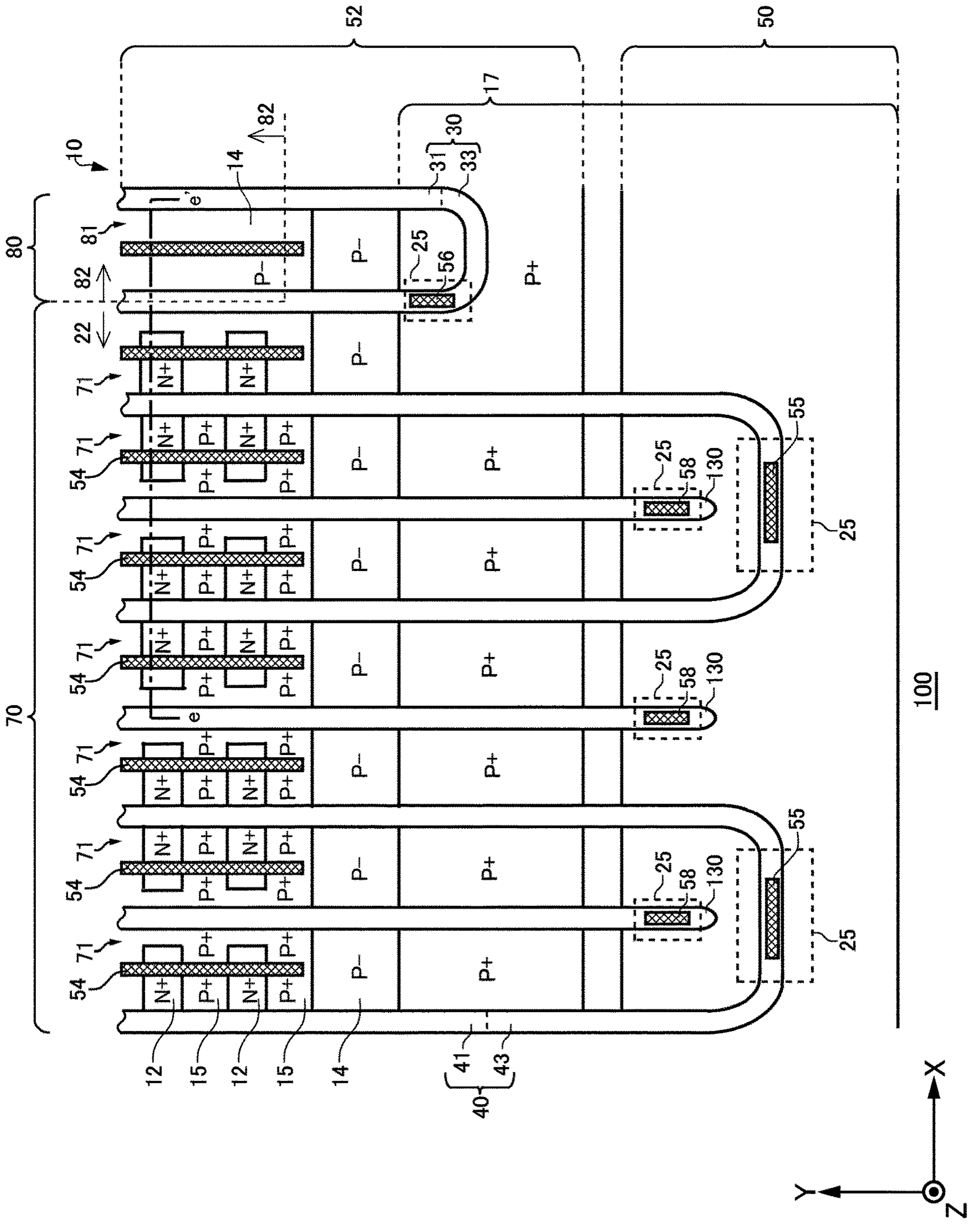
FIG. 7A illustrates an example of a top view of the semiconductor device 100 in a modification example.

FIG. 7A illustrates an example of the top view of the semiconductor device 100 in the modification example. In the present example, the point different from FIG. 1A is described in particular. The semiconductor device 100 in the present example includes a dummy gate trench portion 130 not in contact with the emitter region 12, instead of the dummy trench portion 30. The dummy gate trench portion 130 is an example of the first trench portion adjacent to the gate trench portion 40.

The dummy gate trench portion 130 is a trench portion not in contact with the emitter region 12 and set at the gate potential. That is, although the dummy gate trench portion 130 is set at the gate potential, it is a trench portion not driving the transistor in the adjacent mesa portion 71, and an example of the dummy trench portion other than the dummy trench portion 30. The dummy gate trench portion 130 should be set at the gate potential, and the dummy gate trench portion 130 extends to the region with the gate metal layer 50 provided therein in the Y axis direction. The dummy gate trench portion 130 is set at the gate potential, connected to the gate metal layer 50 via the contact holes 58.

Although the dummy gate trench portion 130 is set at the gate potential, since it is not in contact to the emitter region 12, the channel is not formed by the inversion layer of the first conductivity type on the sidewall of the dummy gate trench portion 130. The dummy gate trench portion 130 makes it easier to attract carriers to the mesa portion 71, so the dummy gate trench portion 130 and the gate capacitance and other properties are different. Accordingly, by using the combination of dummy gate trench portion 130 and dummy trench portion 30, adjustment of threshold voltage, saturation current, electric field strength, and gate capacitance in the semiconductor device 100 can be performed.

On the front surface of the semiconductor substrate 10, the gate trench portion 40 in the present example has a U-shaped structure, while the dummy gate trench portion 130 has an I-shaped structure. However, the structures of gate trench portion 40 and dummy gate trench portion 130 are not limited to these structures as long as the desired array ratio can be achieved.

In the present example, the dummy gate trench portion 130 in the diode portion 80 has a structure similar to that shown in FIG. 1A. That is, the dummy gate trench portion 130 is connected to the emitter electrode 52 via the contact holes 56 and set to be at the emitter potential.

Figure 7B:
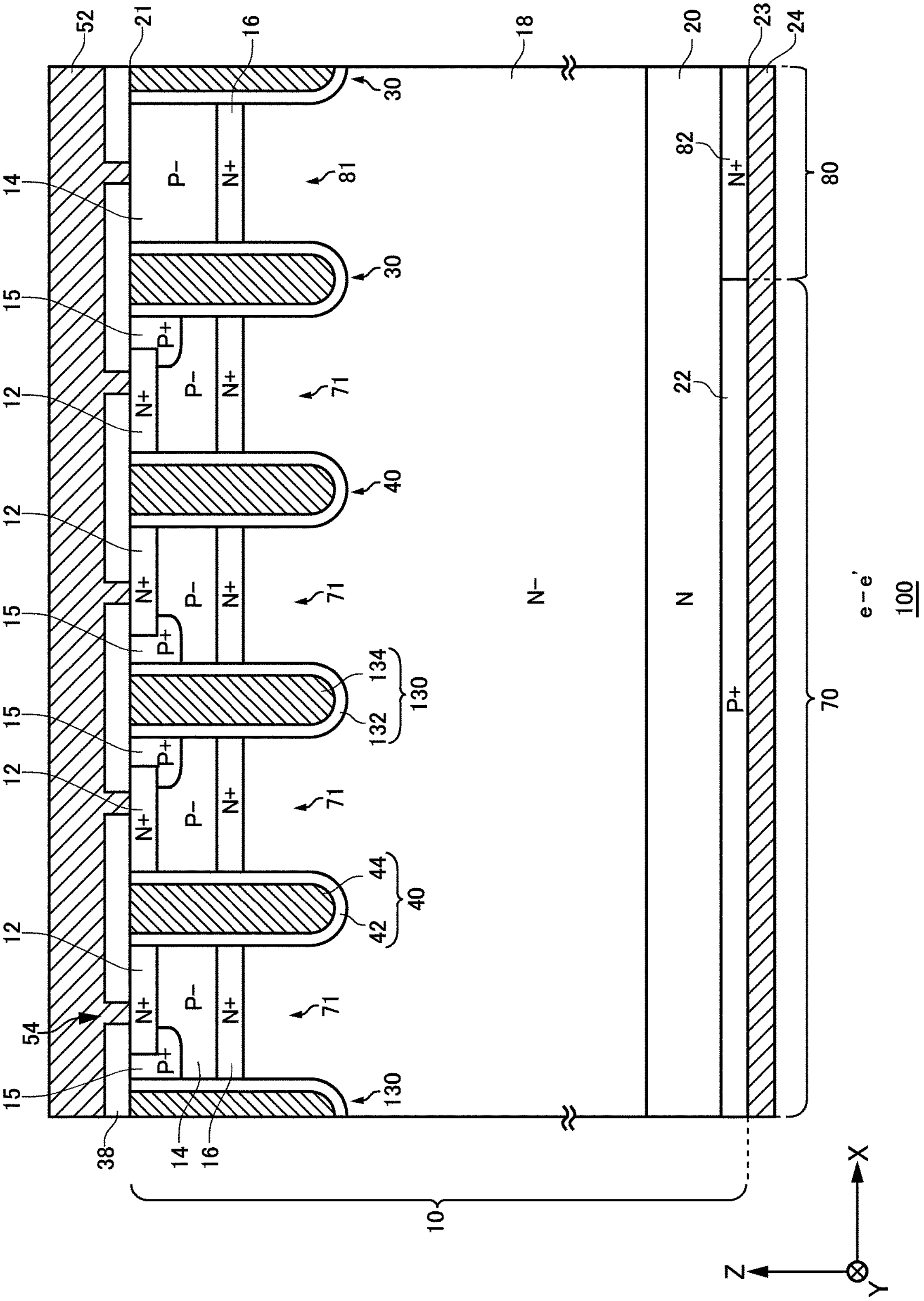
FIG. 7B illustrates an example of e-e' cross sectional view in FIG. 7A.

FIG. 7B illustrates an example of the e-e' cross sectional view in FIG. 7A. The cross section e-e' is the XZ plane passing through the emitter region 12 in the transistor portion 70, from the transistor portion 70 to the diode portion 80. The dummy gate trench portion 130 has a second gate dielectric film 132 and a second gate conductive portion 134.

In the present example, the dummy gate trench portion 130 included in the semiconductor device 100 is at the emitter potential, and further has a configuration similar to that shown in the cross sectional view in FIG. 1B. That is, in the present example, the contact region 15 is below the emitter region 12, and electrically connects to the adjacent contact regions 15 in between. Accordingly, the semiconductor device 100 can suppress latch-up with the structure of the contact region 15 regardless of the potential of the dummy gate trench portion.

Figure 8A:
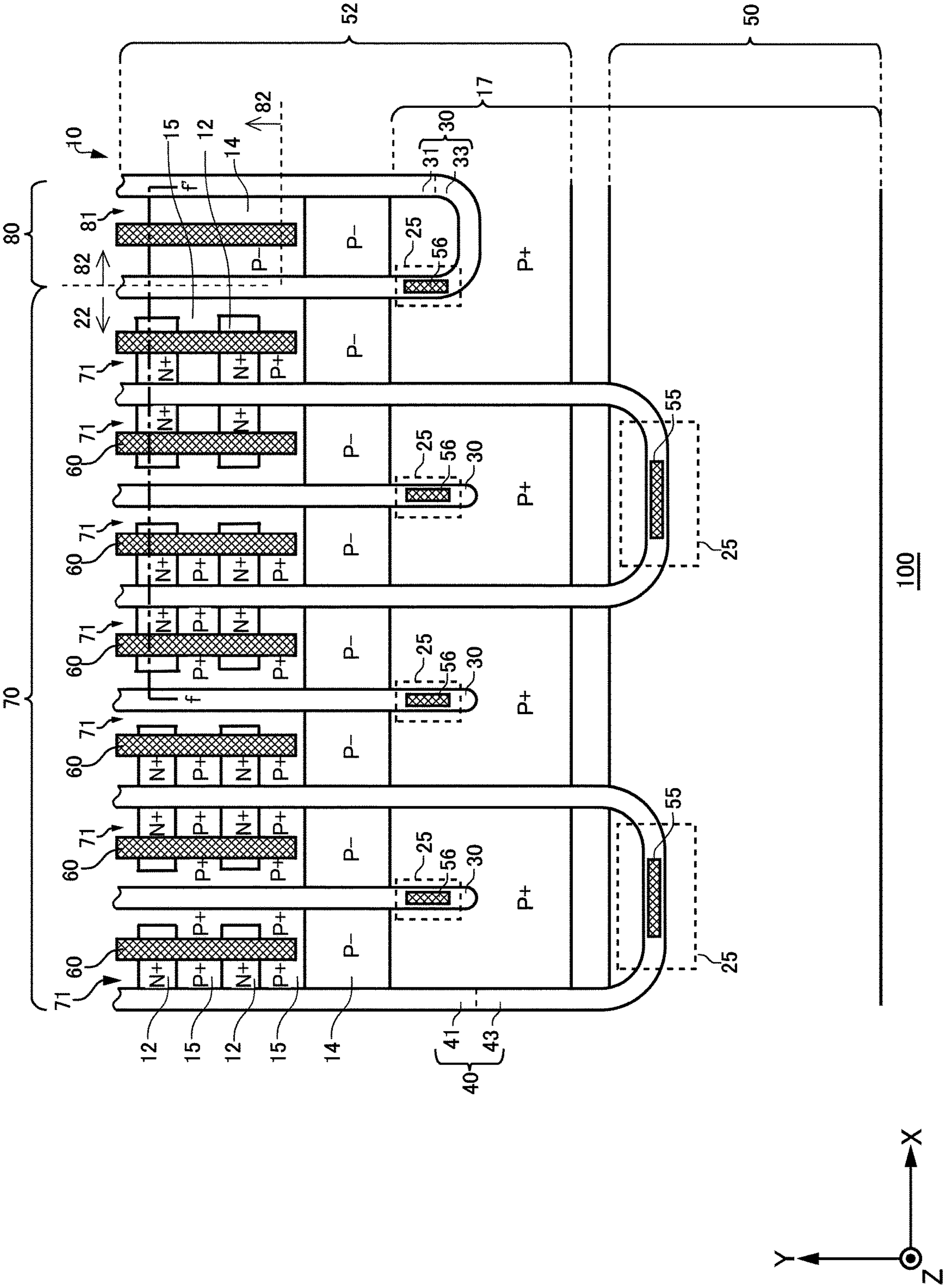
FIG. 8A illustrates an example of a top view of the semiconductor device 100.

FIG. 8A illustrates an example of the top view of the semiconductor device 100. The semiconductor device 100 in the present example includes a contact trench portion 60.

The contact trench portion 60 is provided to extend in the depth direction of the semiconductor substrate 10 from the front surface 21. The contact trench portion 60 electrically connects the emitter electrode 52 and the semiconductor substrate 10. The contact trench portion 60 is provided to extend in the trench extending direction. The contact trench portion 60 in the present example is arranged in a striped shape along the gate trench portion 40 and the dummy trench portion 30.

The contact trench portion 60 is formed above each region of the emitter region 12 and the contact region 15 in the transistor portion 70. The contact trench portion 60 is formed above the region of the base region 14 in the diode portion 80. The contact trench portion 60 is not provided above the well regions 17, which are provided on both ends of the Y axis direction. One or more contact trench portions 60 may be provided to extend in the trench extending direction.

In the mesa portion 71 between the gate trench portion 40 and the contact trench portion 60, the emitter region 12 and the contact region 15 may be arranged alternately in the trench extending direction. In the trench extending direction, the width of the emitter region 12 may be greater than the width of the contact region 15. The width of the emitter region 12 in the trench extending direction may be from 0.6 μm to 1.6 μm. By controlling the ratio of the emitter region 12 to the contact region 15 appropriately, the latch-up can be easily suppressed.

Figure 8B:
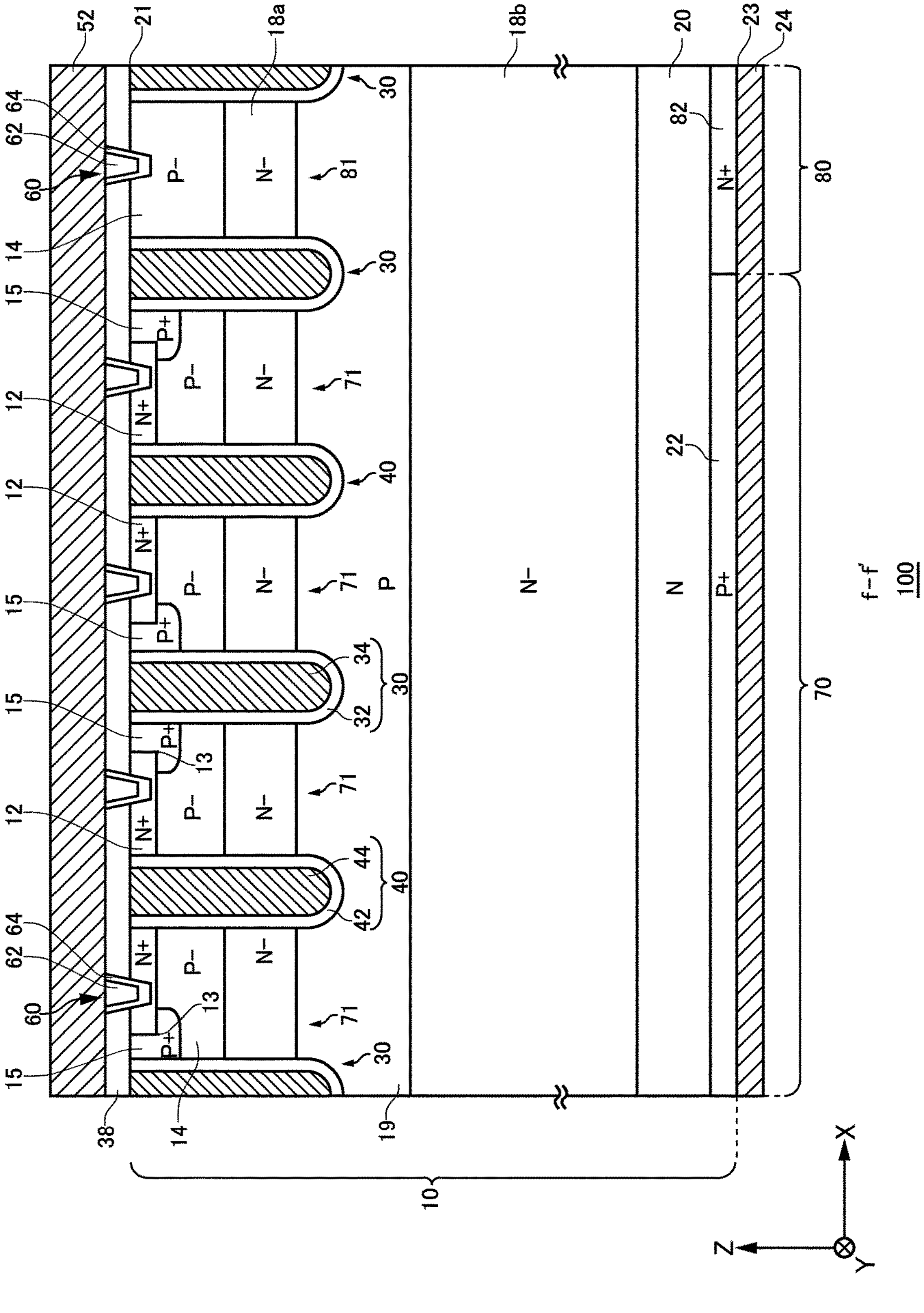
FIG. 8B illustrates an example of f-f' cross sectional view in FIG. 8A.

FIG. 8B illustrates an example of the f-f' cross sectional view in FIG. 8A. The contact trench portion 60 in the present example is formed shallower than the emitter region 12.

The contact trench portion 60 is provided to extend to the back surface 23 side of the semiconductor substrate 10 further than the front surface 21. The lower end of the contact trench portion 60 in the present example is shallower than the lower end of the emitter region 12. The emitter regions 12 are provided on both ends of the contact trench portion 60 in the trench array direction. The contact trench portion 60 has a plug 62 and a barrier metal layer 64.

The plug 62 is made of a conductive material provided inside the contact trench portion 60. The plug 62 may be made of the same material as the emitter electrode 52, or may be a different material. The plug 62 may include a material such as tungsten.

The barrier metal layer 64 is provided below the plug 62. The barrier metal layer 64 in the present example is provided between the plug 62 and the emitter region 12. The barrier metal layer 64 may include a material such as titanium nitride.

The emitter region 12 is provided to be in contact with the gate trench portion 40. The emitter region 12 may be or may not be in contact with the dummy trench portion 30. The emitter region 12 in the present example is provided to extend to the dummy trench portion 30 side further than the contact trench portion 60 in the trench array direction. That is, the lower end 13 is provided between the dummy trench portion 30 and the contact trench portion 60 in the trench array direction.

At least a part of the contact region 15 is provided below the lower end 13 in the mesa portion 71. The contact region 15 in the present example is provided to extend from the dummy trench portion 30 to the bottom of the lower end 13 of the emitter region 12 in the trench array direction. The contact region 15 may extend beyond the contact trench portion 60 from the dummy trench portion 30, or may not beyond the contact trench portion 60 in the trench array direction. The contact region 15 in the present example is provided between the dummy trench portion 30 and the contact trench portion 60 in the trench array direction.

The trench bottom region 19 is a second conductivity type region provided below the dummy trench portion 30 and the gate trench portion 40. The trench bottom region 19 in the present example covers the lower ends of the dummy trench portion 30 and the gate trench portion 40. The doping concentration of the trench bottom region 19 may be less than the base region 14. The trench bottom region 19 is provided between the drift region 18*a* and the drift region 18*b*. By providing the trench bottom region 19, the avalanche capability can be improved. Note that the embodiment where the semiconductor device 100 includes the trench bottom region 19 may be described, but the trench bottom region 19 may also be omitted.

The drift region 18*a* is provided between the base region 14 and the trench bottom region 19 in the mesa portion 71 and the mesa portion 81. The drift region 18*b* is provided below the trench bottom region 19. The doping concentration of the drift region 18*a* and the drift region 18*b* may be the same.

Figure 9A:
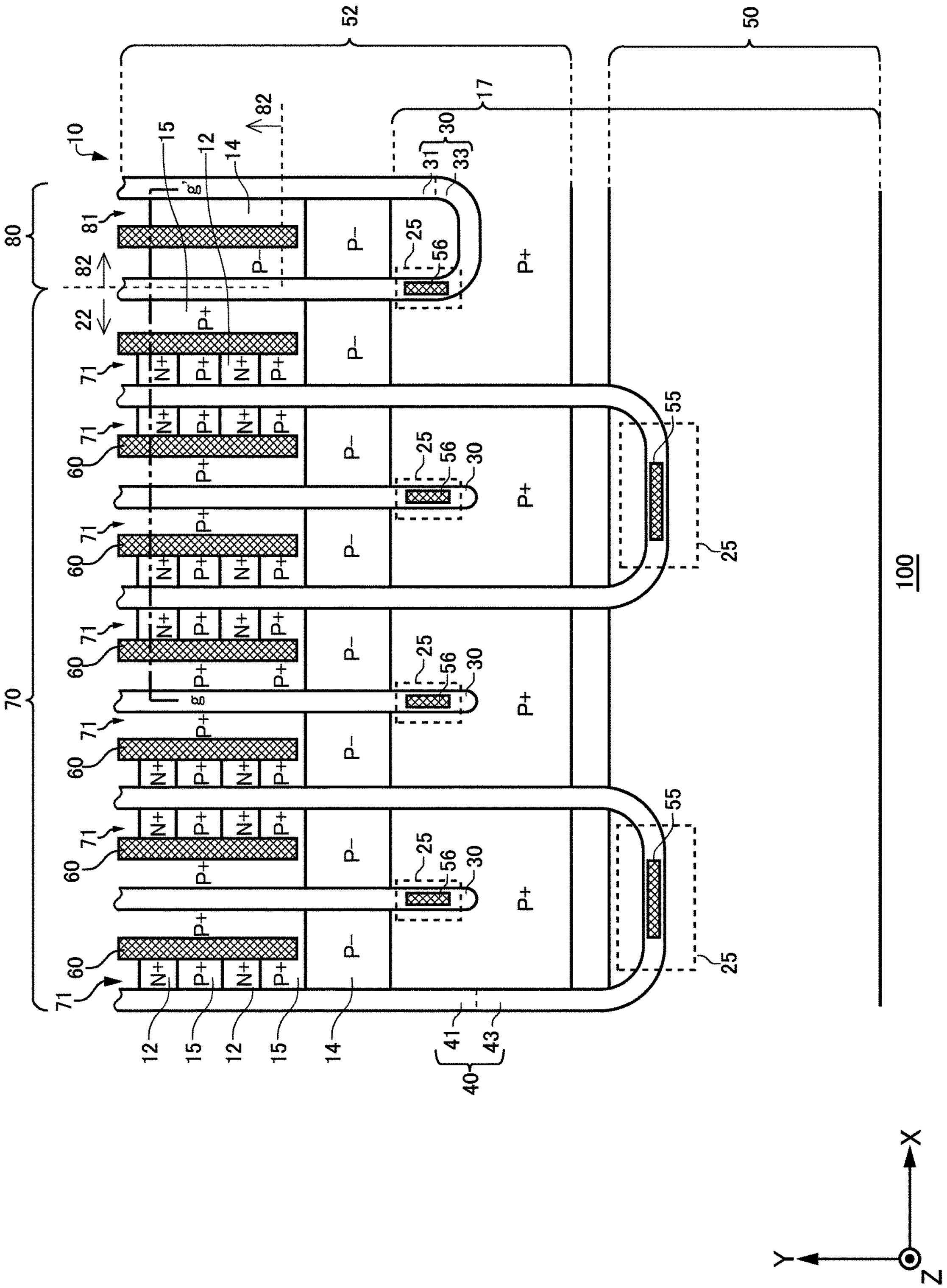
FIG. 9A illustrates an example of a top view of the semiconductor device 100.

FIG. 9A illustrates an example of the top view of the semiconductor device 100. In the semiconductor device 100 in the present example, the arrangement of the emitter region 12 and the contact region 15 on the front surface 21 is different from the embodiment in FIG. 8A. In the present example, the different points from the embodiment in FIG. 8A are described in particular. The present example is different from the embodiment in FIG. 8A in the point of providing the emitter region 12 on one side of the contact trench portion 60.

The emitter region 12 is provided to be in contact with the gate trench portion 40. The emitter region 12 is provided to extend from the gate trench portion 40 to the sidewall of the contact trench portion 60 in the trench array direction. The emitter region 12 may be not provided between the dummy trench portion 30 and the contact trench portion 60.

Figure 9B:
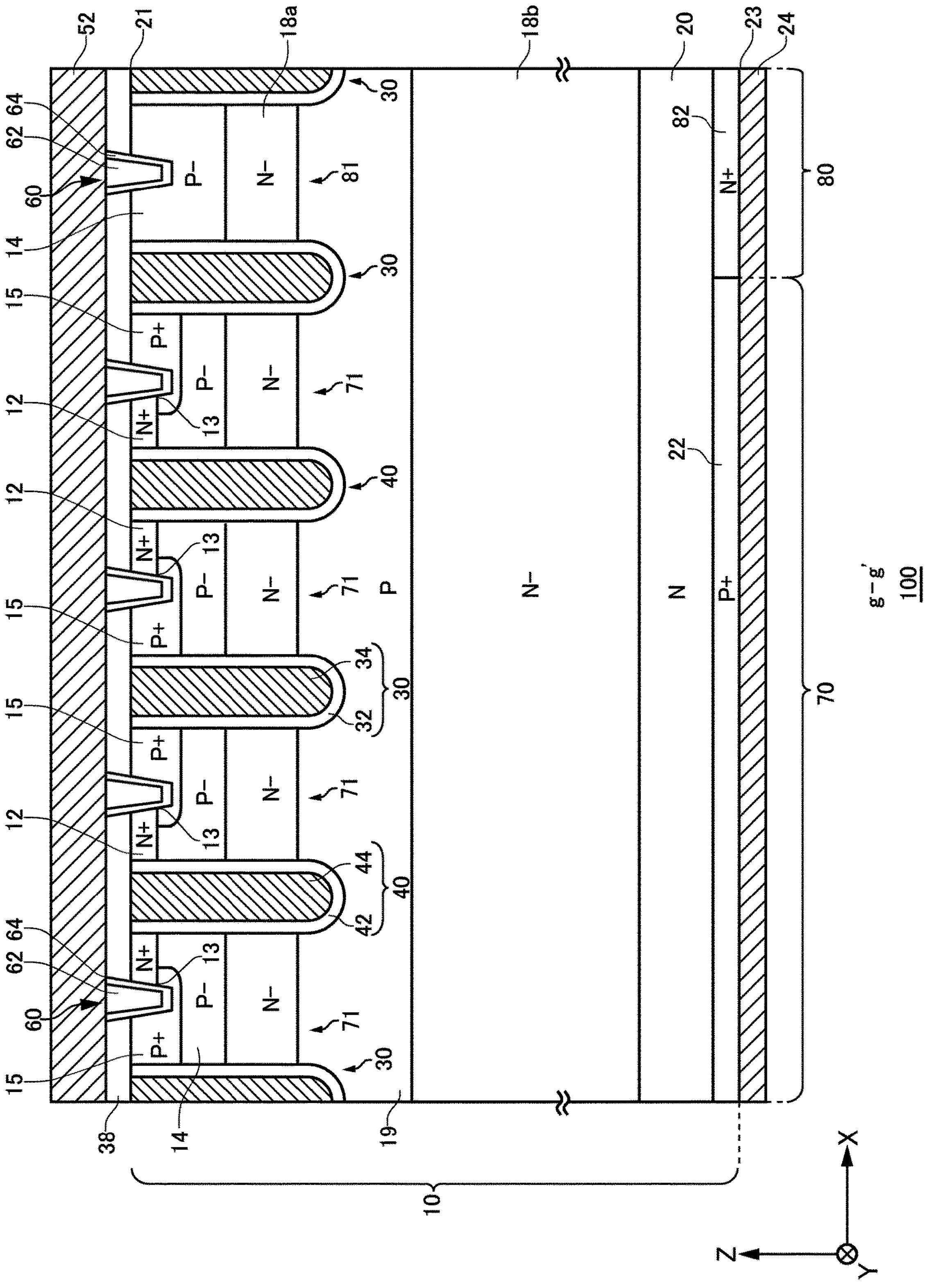
FIG. 9B illustrates an example of g-g' cross sectional view in FIG. 9A.

FIG. 9B is an example of the g-g' cross sectional view in FIG. 9A. The contact trench portion 60 in the present example is formed deeper than the embodiment of FIG. 8B.

The contact trench portion 60 is provided to extend to the back surface 23 side of the semiconductor substrate 10 further than the emitter region 12. That is, the lower end of the contact trench portion 60 in the present example is deeper than the lower end of the emitter region 12. The lower end of the contact trench portion 60 in the present example is shallower than the lower end of the contact region 15.

The emitter region 12 is provided to extend from the gate trench portion 40 to the sidewall of the contact trench portion 60 in the trench array direction. Therefore, the lower end 13 is positioned on the sidewall of the contact trench portion 60, between the gate trench portion 40 and the contact trench portion 60 in the trench array direction.

Figure 10A:
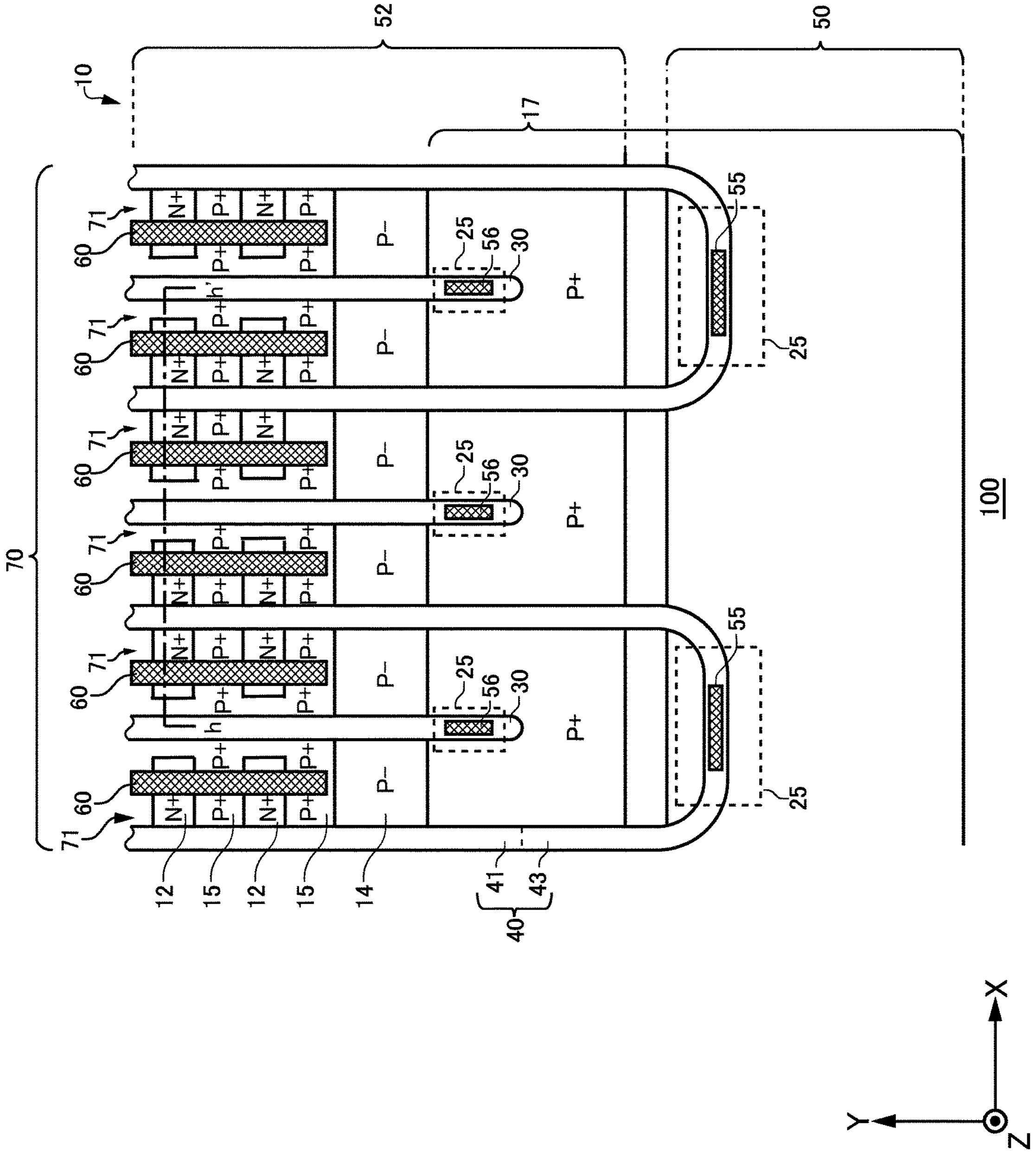
FIG. 10A illustrates an example of a top view of the semiconductor device 100.

FIG. 10A illustrates an example of the top view of the semiconductor device 100. The semiconductor device 100 in the present example is different from the embodiment in FIG. 8A in a point of not including the diode portion 80.

Figure 10B:
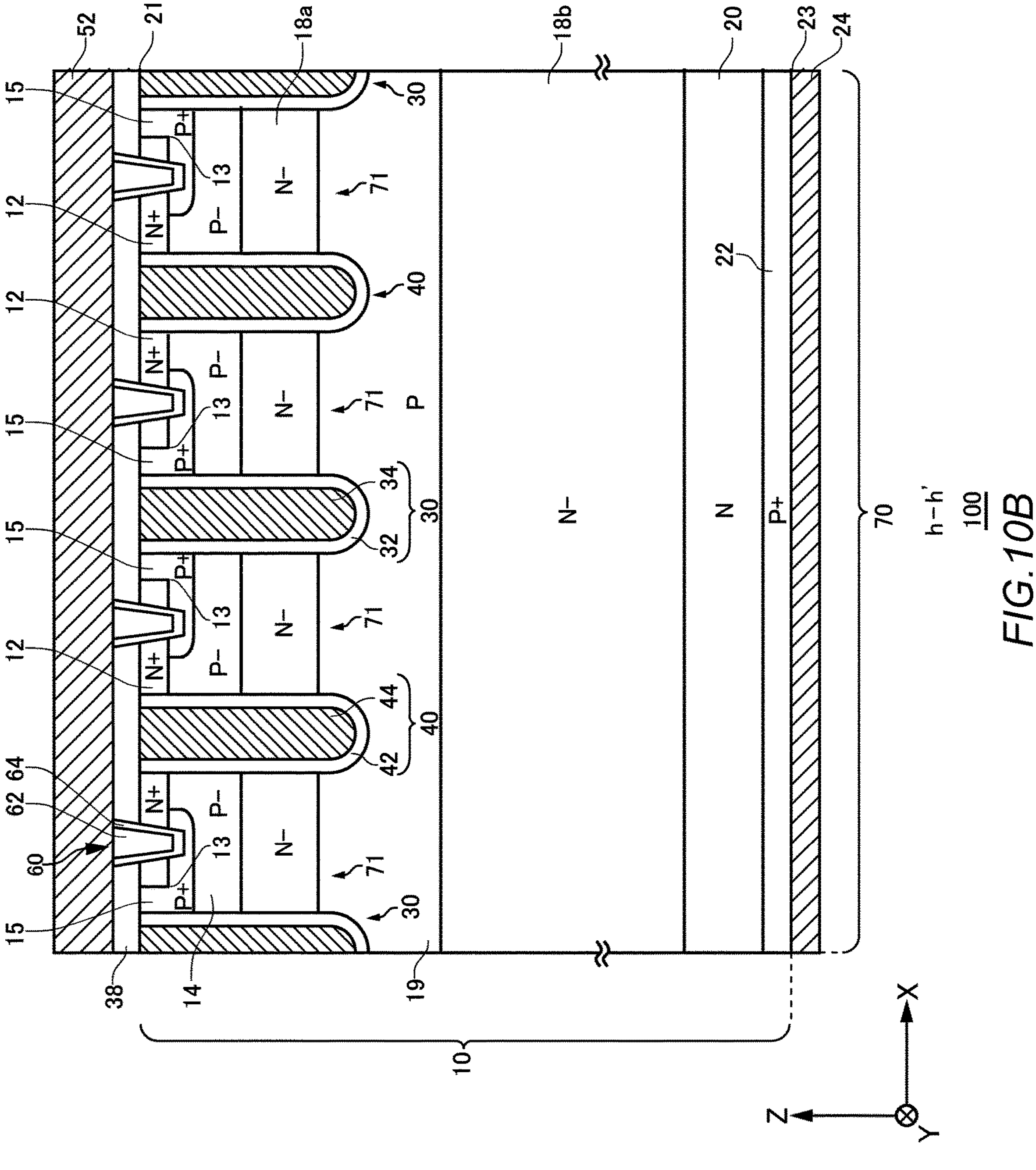
FIG. 10B illustrates an example of h-h' cross sectional view in FIG. 10A.

FIG. 10B illustrates an example of the h-h' cross sectional view in FIG. 10A. The contact trench portion 60 in the present example is formed deeper than the embodiment of FIG. 8B.

The contact trench portion 60 is provided to extend to the back surface 23 side of the semiconductor substrate 10 further than the emitter region 12. The lower end of the contact trench portion 60 in the present example is deeper than the lower end of the emitter region 12, and is shallower than the lower end of the contact region 15. The emitter regions 12 are provided on both ends of the contact trench portion 60 in the trench array direction.

The emitter region 12 is provided to extend to the dummy trench portion 30 side further than the contact trench portion 60 in the trench array direction. That is, the lower end 13 is provided between the dummy trench portion 30 and the contact trench portion 60 in the trench array direction.

Figure 10C:
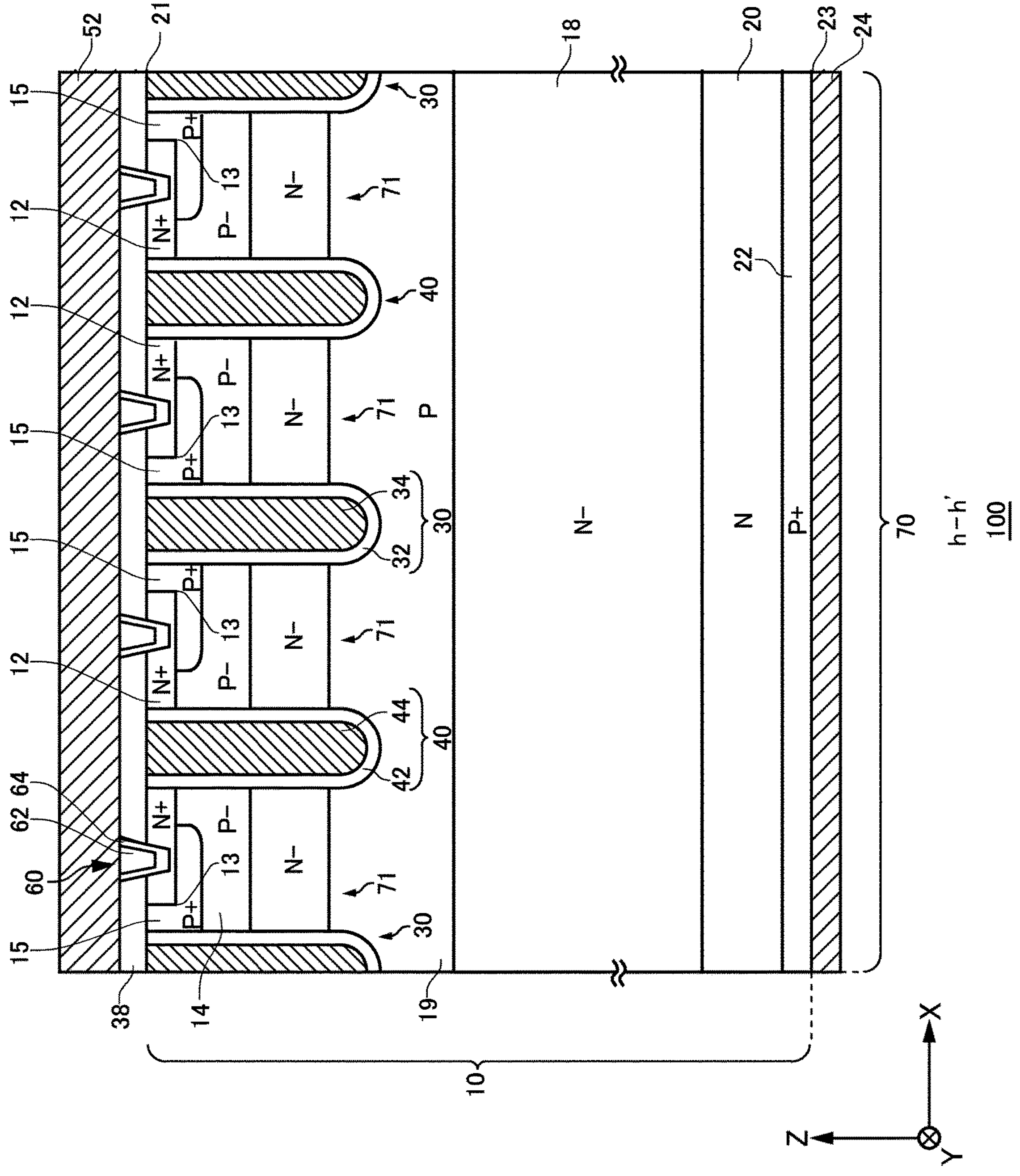
FIG. 10C illustrates another example of h-h' cross sectional view in FIG. 10A.

FIG. 10C illustrates another example of the h-h' cross sectional view in FIG. 10A. In the present example, the depth of the contact trench portion 60 is different from the embodiment in FIG. 10B. The contact trench portion 60 in the present example is formed shallower than the emitter region 12. That is, the lower end of the contact trench portion 60 in the present example is shallower than the lower end of the emitter region 12.

As described above, the depth of the contact trench portion 60 is not limited to the embodiment, and may be changed appropriately. Also, the emitter region 12 may be provided on both ends of the contact trench portion 60 in the trench array direction, or may be provided on one side. Also, in each embodiment, the semiconductor device 100 may include the trench bottom region 19 or may not.

Figure 11A:
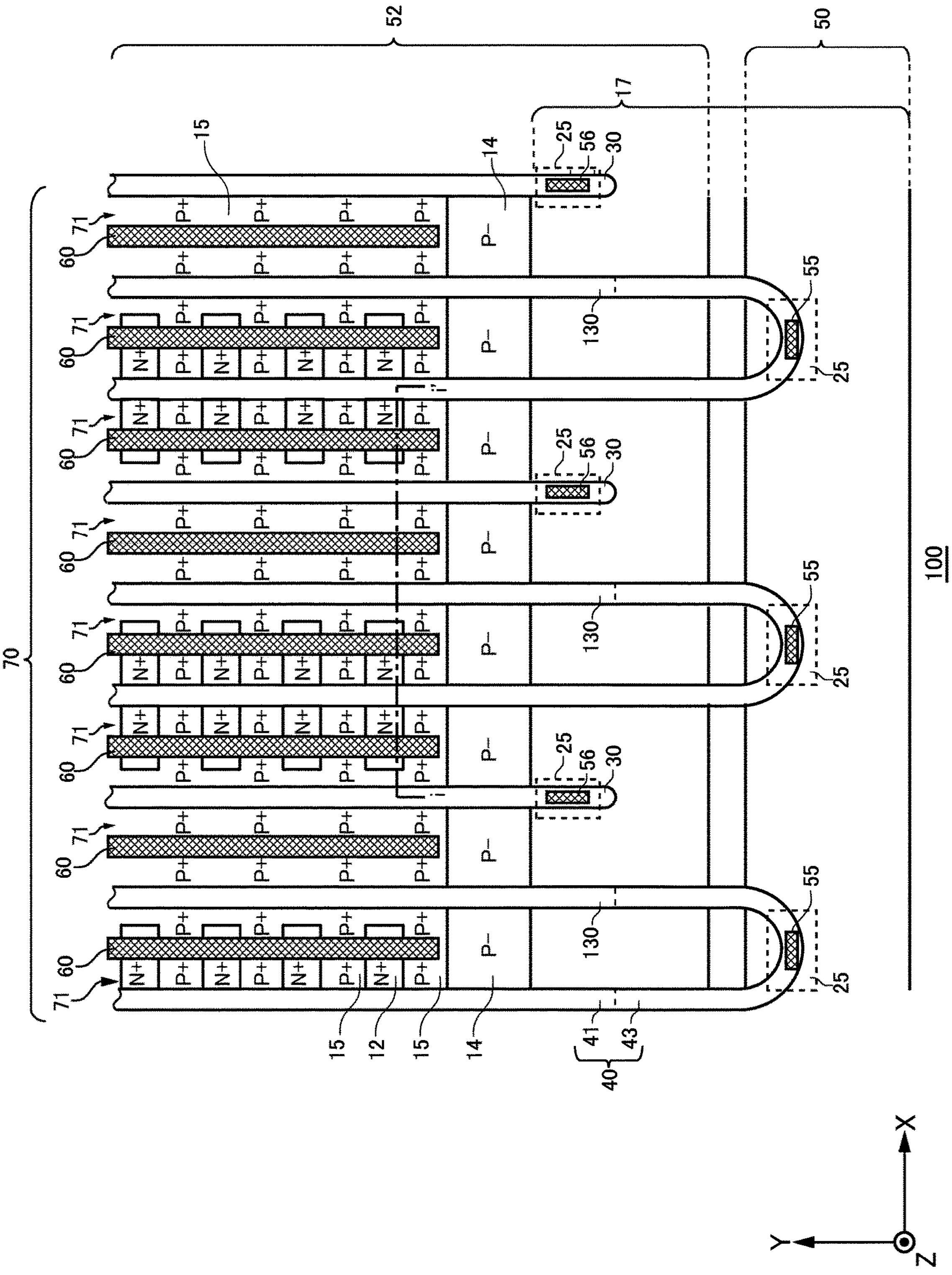
FIG. 11A illustrates an example of a top view of the semiconductor device 100.

FIG. 11A illustrates an example of the top view of the semiconductor device 100. The semiconductor device 100 in the present example includes a dummy gate trench portion 130 provided to be adjacent to the gate trench portion 40 together with the dummy trench portion 30 provided to be adjacent to the gate trench portion 40.

The dummy gate trench portion 130 is a trench portion, set to be at the gate potential, not in contact with the emitter region 12. The dummy gate trench portion 130 in the present example is coupled to the extending portion 41 by the connection portion 43.

The emitter region 12 is provided to be in contact with the gate trench portion 40 and spaced apart from the dummy gate trench portion 130 in the mesa portion 71 between the gate trench portion 40 and the dummy gate trench portion 130.

Also, the emitter region 12 is provided to be in contact with the gate trench portion 40 and spaced apart from the dummy trench portion 30 in the mesa portion 71 between the gate trench portion 40 and the dummy trench portion 30.

Figure 11B:
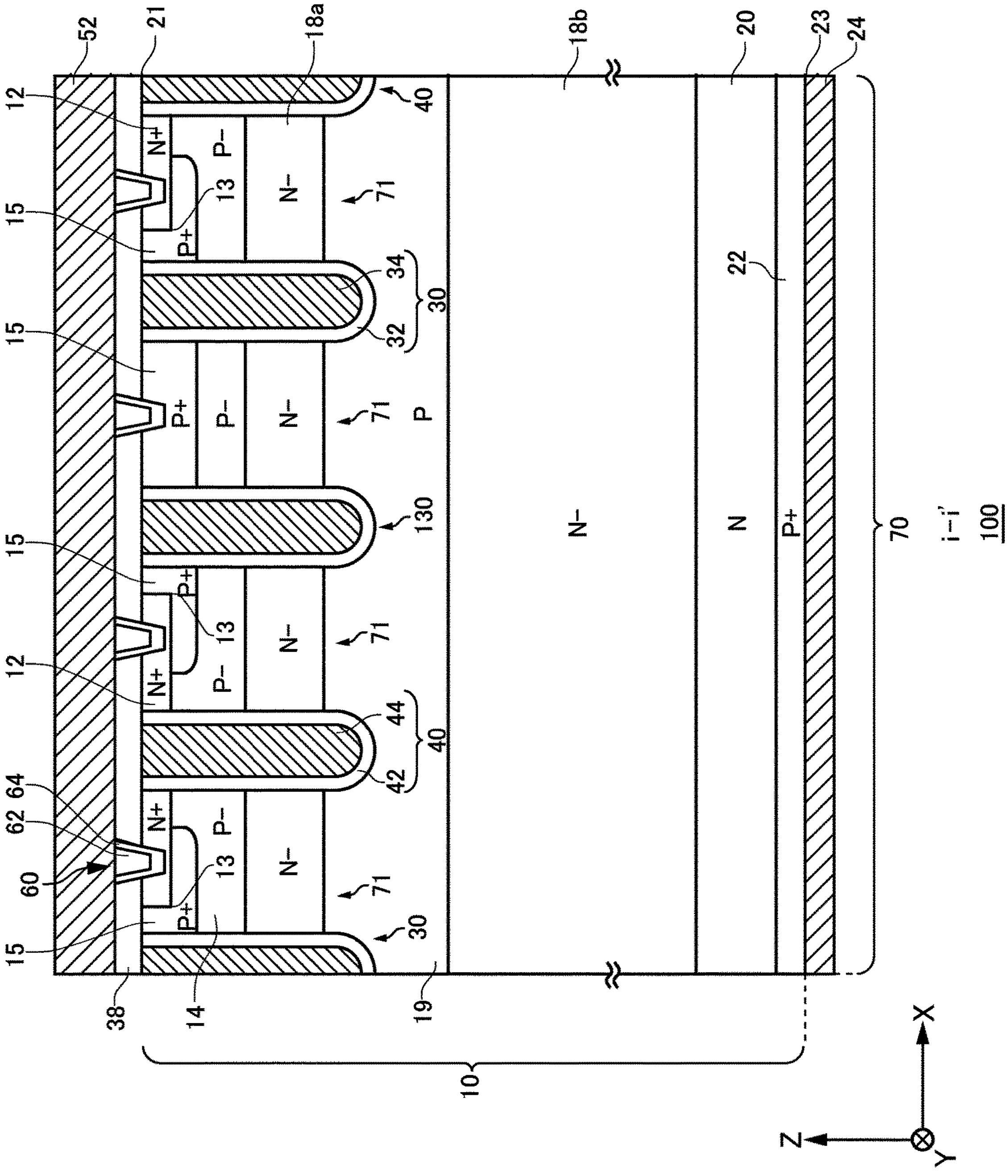
FIG. 11B illustrates an example of i-i' cross sectional view in FIG. 11A.

FIG. 11B is an example of the i-i' cross sectional view in FIG. 11A. The semiconductor device 100 in the present example includes a contact trench portion 60 shallower than the emitter regions 12 and the emitter regions 12 provided on both ends of the contact trench portion 60 in the trench array direction, but it is not limited to this. The dummy gate trench portion 130 is a dummy trench, the same as the dummy trench portion 30. Therefore, a part of the dummy gate trench portion 130 may be replaced by a dummy trench portion 30 at the emitter potential. In this way, since the gate capacitance can be adjusted, the most appropriate switching speed can be achieved.

The contact region 15 is provided below the lower end 13 of the dummy gate trench portion 130 side of the emitter region 12 in the mesa portion 71 between the gate trench portion 40 and the dummy gate trench portion 130. Also, the contact region 15 is provided below the lower end 13 of the dummy trench portion 30 side of the emitter region 12 in the mesa portion 71 between the gate trench portion 40 and the dummy trench portion 30.

Figure 12A:
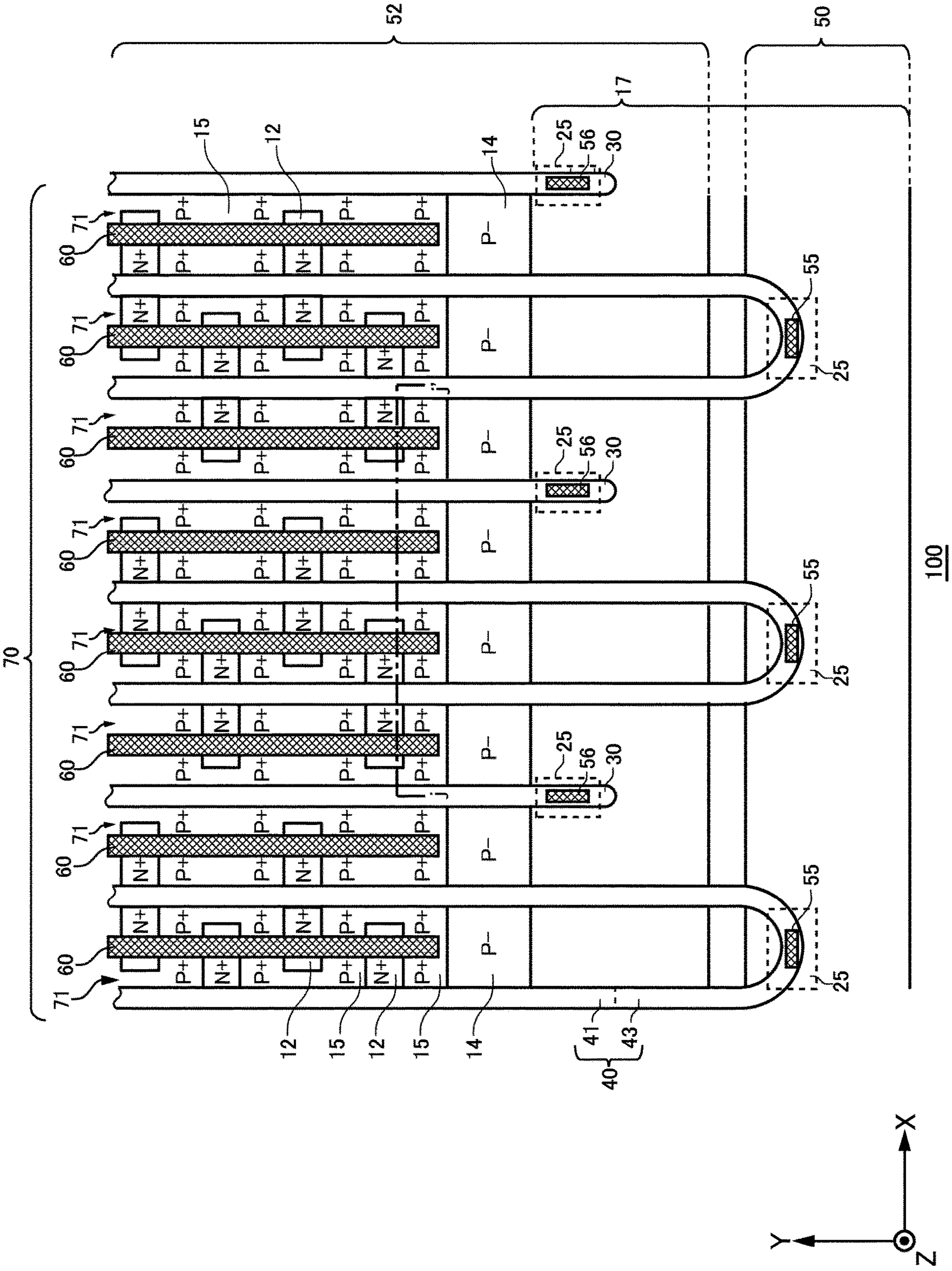
FIG. 12A illustrates an example of a top view of the semiconductor device 100.

FIG. 12A illustrates an example of the top view of the semiconductor device 100. The semiconductor device 100 in the present example is different from the embodiment in FIG. 11A in the point of including a staggered structure when the first trench portion adjacent to the gate trench portion 40 is the gate trench portion 40. The semiconductor device 100 has a plurality of gate trench portions 40 provided to be adjacent. The plurality of gate trench portions 40 provided to be adjacent may be connected to each other by the connection portion 43.

The plurality of gate trench portions 40 provided to be adjacent are in different locations in the trench extending direction and contact with the emitter region 12. That is, the semiconductor device 100 includes emitter regions 12, with the staggered structure, arrayed alternately. In this case, each of the adjacent gate trench portions 40 has both of the portion that becomes a gate trench portion and the portion that becomes the first trench portion. That is, in the mesa portion between the adjacent gate trench portions 40, an emitter region 12 (first emitter region) being in contact with one gate trench portion 40 and spaced apart from the other gate trench portion 40, and an emitter region 12 (second emitter region) being spaced apart from one gate trench portion 40 and in contact with the other gate trench portion 40 are included. Then the contact region 15 is provided in a region including the bottom of the lower end 13 on the other gate trench portion 40 side of the first emitter region and the bottom of the lower end 13 on one gate trench portion 40 side of the second emitter region. Also, in the trench extending direction of the gate trench portion 40, the first emitter region and the second emitter region are provided alternately sandwiching the contact region 15.

Figure 12B:
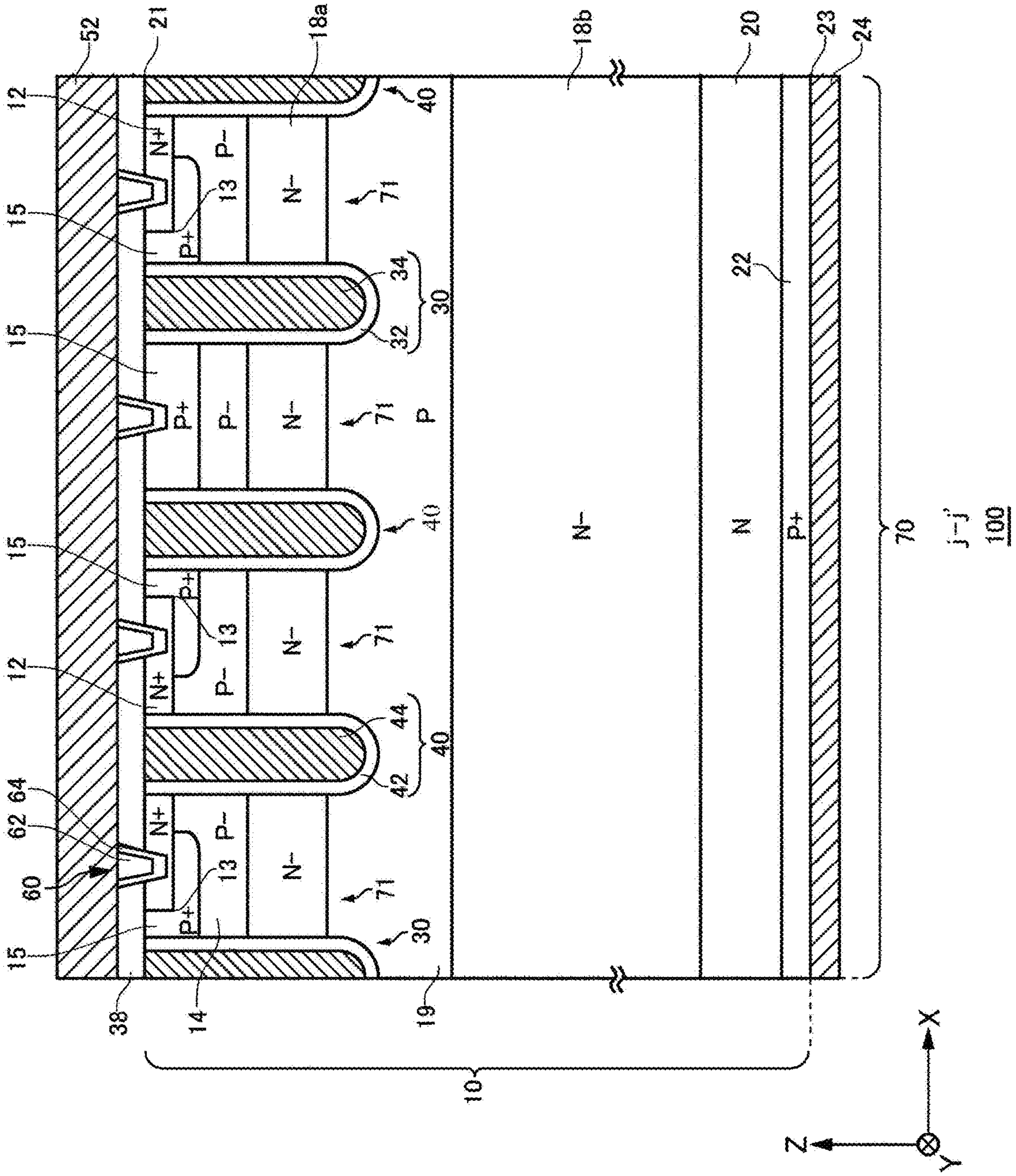
FIG. 12B illustrates an example of j-j' cross sectional view in FIG. 12A.

FIG. 12B illustrates an example of the j-j' cross sectional view in FIG. 12A. The semiconductor device 100 in the present example includes a contact trench portion 60 shallower than the emitter regions 12 and the emitter regions 12 provided on both ends of the contact trench portion 60 in the trench array direction, but it is not limited to this. That is, the semiconductor device 100 may include a contact trench portion 60 deeper than the emitter region 12, and may also include an emitter region 12 provided on one side of the contact trench portion 60. The semiconductor device 100 may include a trench bottom region 19 or may not.

Figure 13A:
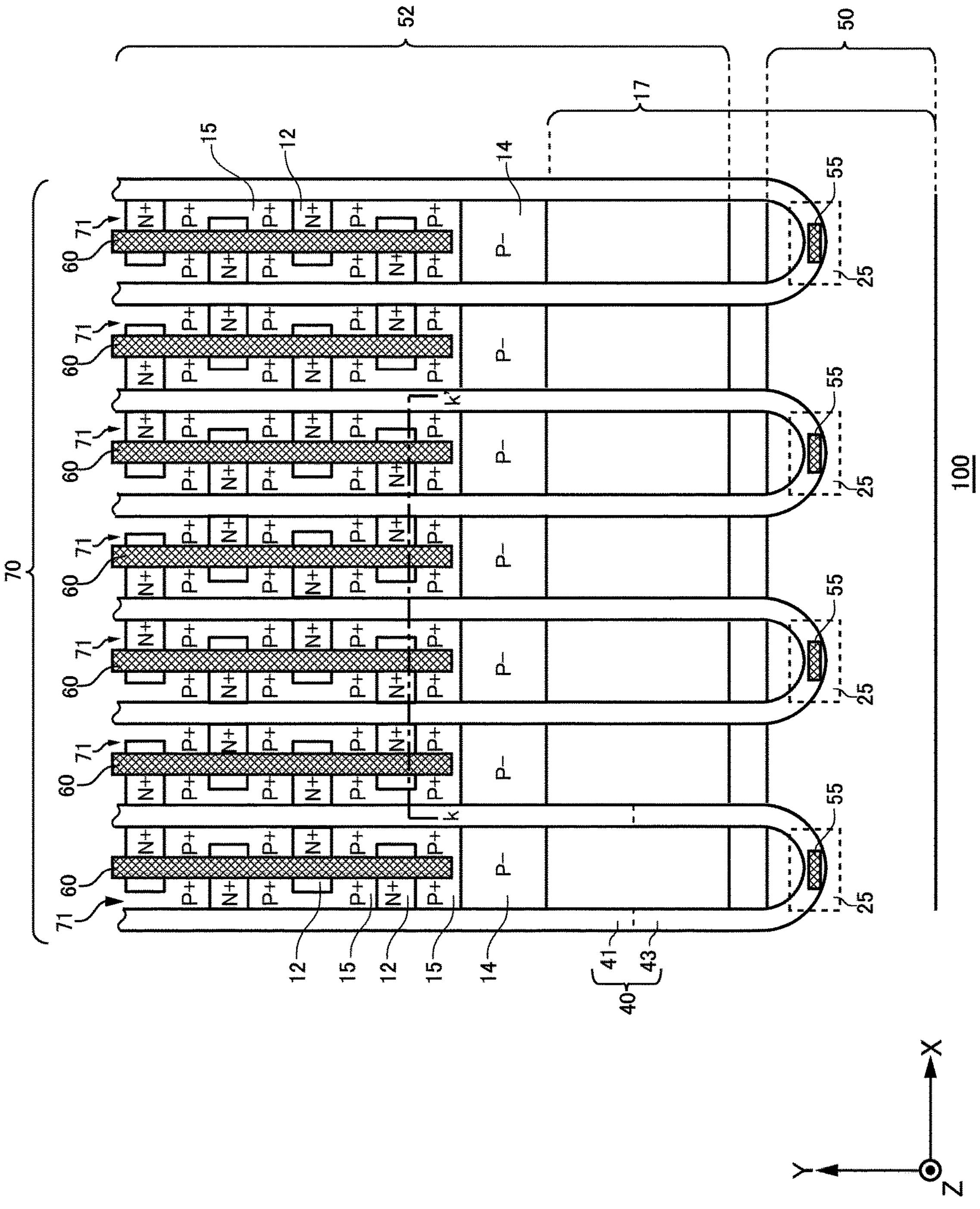
FIG. 13A illustrates an example of a top view of the semiconductor device 100.

FIG. 13A illustrates an example of a top view of the semiconductor device 100. The semiconductor device 100 in the present example is different from the embodiment in FIG. 12A in the point of providing only the gate trench portion 40 without providing the dummy trench portion 30. The semiconductor device 100 in the present example has a staggered structure with which the emitter regions 12 are arrayed alternately, similar to the embodiment in FIG. 12A. The semiconductor device 100 in the present example has a greater ratio of the emitter region 12 in the front surface 21 than the embodiment in FIG. 12A. Even if the semiconductor device 100 in the present example has a greater ratio of the emitter region 12 in the front surface 21, since a part of the emitter regions 12 are spaced apart from the gate trench portion 40, the latch-up of the semiconductor device 100 can be suppressed.

Figure 13B:
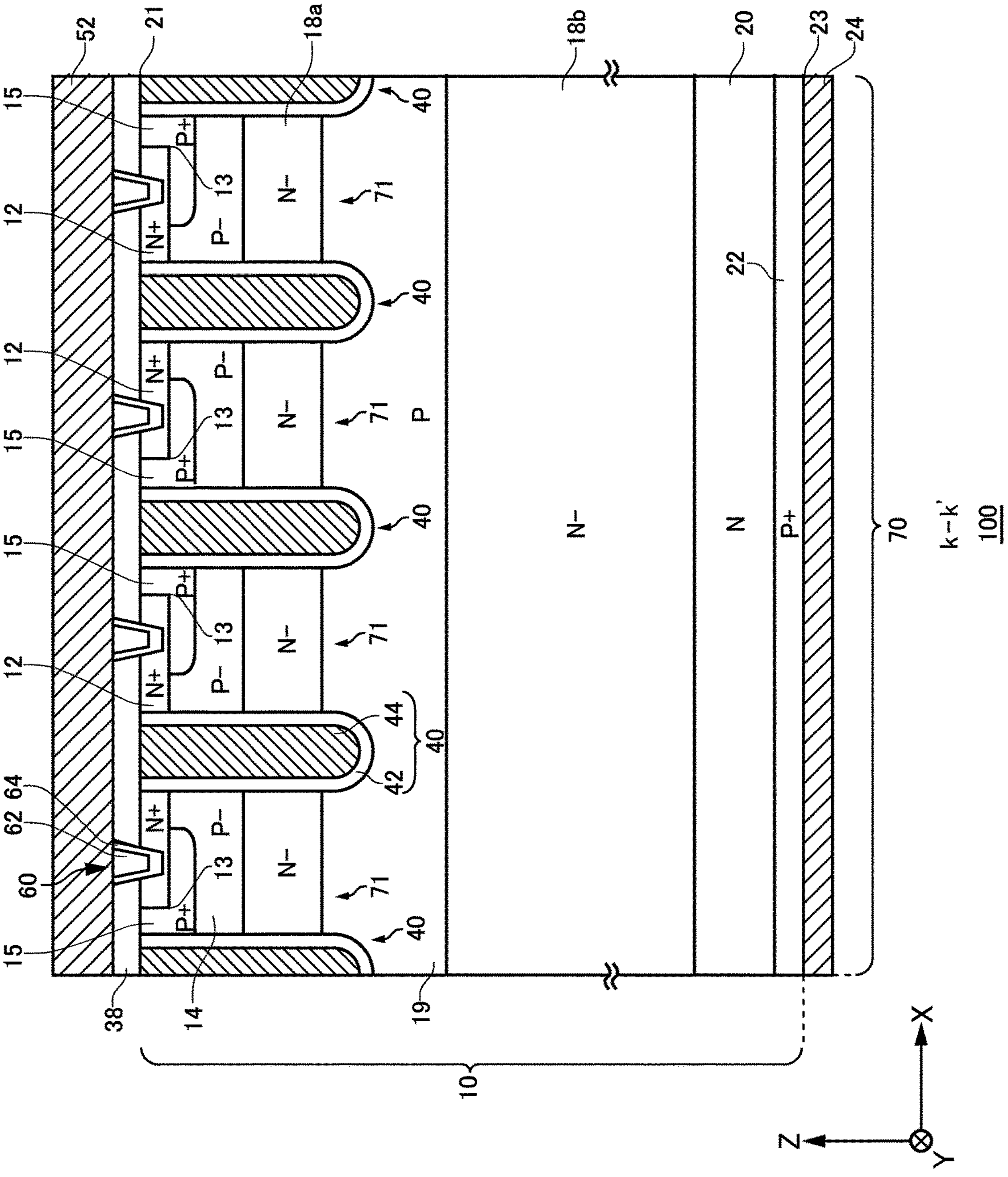
FIG. 13B illustrates an example of k-k' cross sectional view in FIG. 13A.

FIG. 13B illustrates an example of the k-k' cross sectional view in FIG. 13A. The semiconductor device 100 in the present example includes a contact trench portion 60 shallower than the emitter regions 12 and the emitter regions 12 provided on both ends of the contact trench portion 60 in the trench array direction, but it is not limited to this. The emitter region 12 in the present example is provided on both ends sandwiching the gate trench portion 40 in the trench array direction. In this case, by patterning the adjacent emitter regions 12 together sandwiching the gate trench portion 40, process reliability can be maintained even when the mesa width is reduced.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention. For example, although the example of RC-IGBT is described in the present example, it is also applicable to IGBTs and MOSFETs.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCES

10: semiconductor substrate; 12: emitter region; 13: lower end; 14: base region; 15: contact region; 16: accumulation region; 17: well region; 18: drift region; 19: trench bottom region; 20: buffer region; 21: front surface; 22: collector region; 23: back surface; 24: collector electrode; 25: connection portion; 30: dummy trench portion; 31: extending portion; 32: dummy dielectric film; 33: connection portion; 34: dummy conductive portion; 38: interlayer dielectric film; 40: gate trench portion; 41: extending portion; 42: gate dielectric film; 43: connection portion; 44: gate conductive portion; 50: gate metal layer; 52: emitter electrode; 54: contact holes; 55: contact holes; 56: contact holes; 58: contact holes; 59: disconnected region; 60: contact trench portion; 62: plug; 64: barrier metal layer; 70: transistor portion; 71: mesa portion; 80: diode portion; 81: mesa portion; 82: cathode region; 92: surface region; 94: lower region; 100: semiconductor device; 130: dummy gate trench portion; 132: second gate dielectric film; 134: second gate conductive portion

What is claimed is:

1. A semiconductor device comprising:

a drift region of a first conductivity type, provided in a semiconductor substrate, the semiconductor substrate having an upper surface;

one or more mesa portions, each of the one or more mesa portions being defined at least in part by a gate trench portion extending into the semiconductor substrate from the upper surface of the semiconductor substrate, the gate trench portion of each of the one or more mesa portions comprising a straight, elongated first extending portion, a straight, elongated second extending portion, and a connection portion connecting one end of the first extending portion to a nearest end of the second extending portion, wherein the first extending portion and the second extending portion extend in parallel in an extending direction and the first extending portion and the second extending portion are spaced apart in a trench array direction that is perpendicular to the extending direction, wherein both the trench array direction and the extending direction are parallel to the upper surface of the semiconductor substrate, wherein each of the first extending portion and the second extending portion has a length, and wherein the first extending portion and the second extending portion of the gate trench portion are both conductively connected to a single, common gate metal layer;

a base region of a second conductivity type, provided above the drift region within each of the one or more mesa portions;

a first plurality of emitter regions of the first conductivity type, with a doping concentration higher than the drift region, provided above the base region in contact with the first extending portion of the gate trench portion and distributed along the length of the first extending portion, each of the first plurality of emitter regions extends from the first extending portion of the gate trench portion toward the second extending portion of the gate trench portion and terminates without reaching the second extending portion of the gate trench portion;

a contact region of the second conductivity type, with a doping concentration higher than the base region, provided above at least a portion of the base region within each of the one or more mesa portions, wherein within each of the one or more mesa portions between the first extending portion of the gate trench portion and the second extending portion of the gate trench portion, in cross sections through each of the first plurality of emitter regions parallel to the trench array direction, the contact region is provided below a lower end of each of the first plurality of emitter regions, extends toward the first extending portion of the gate trench portion from a bottom of the lower end of each of the first plurality of emitter regions in the trench array direction, is in contact with the second extending portion of the gate trench portion opposite each of the first plurality of emitter regions, and terminates without reaching the first extending portion of the gate trench portion, and wherein no dummy trench portions are provided intermediate the first extending portion and the second extending portion of the gate trench portion.

2. The semiconductor device according to claim 1, further comprising:

a second plurality of emitter regions of the first conductivity type, with a doping concentration higher than the drift region, provided above the base region in contact with the second extending portion of the gate trench portion and distributed along the length of the second extending portion, each of the second plurality of emitter regions extending from the second extending portion of the gate trench portion toward the first extending portion of the gate trench portion and terminates without reaching the first extending portion of the gate trench portion;

wherein within each of the one or more mesa portions between the first extending portion of the gate trench portion and the second extending portion of the gate trench portion, in cross sections through each of the second plurality of emitter regions parallel to the trench array direction, the contact region is provided below a lower end of each of the second plurality of emitter regions, extends toward the second extending portion of the gate trench portion from a bottom of the lower end of each of the second plurality of emitter regions in the trench array direction, is in contact with the first extending portion of the gate trench portion opposite each of the second plurality of emitter regions, and terminates without reaching the second extending portion of the gate trench portion.

3. The semiconductor device according to claim 1, wherein the contact region is in contact with a lower surface of each of the first plurality of emitter regions in the mesa portion.

4. The semiconductor device according to claim 2, wherein the first plurality of emitter regions and the second plurality of emitter regions are provided in a staggered arrangement in each of the one or more mesa portions extending direction.

5. The semiconductor device according to claim 1, comprising:

an interlayer dielectric film provided above the semiconductor substrate, wherein each of the first plurality of the emitter regions is connected electrically to an emitter electrode via one or more contact holes provided penetrating the interlayer dielectric film.

6. The semiconductor device according to claim 5, wherein each of the first plurality of the emitter regions extends from the first extending portion the gate trench portion toward the second extending portion of the gate trench portion beyond the one or more contact holes in the trench array direction.

7. The semiconductor device according to claim 1, comprising an accumulation region of the first conductivity type with a higher doping concentration than the drift region, between the drift region and the base region.

8. The semiconductor device according to claim 1, wherein no part of any of the first plurality of emitter regions reaches the second extending portion of the gate trench portion.

9. The semiconductor device according to claim 1, wherein:

the gate trench portion has a first trench dielectric film and a first trench conductive portion; and the first trench conductive portion is set to be at a gate potential.

10. A semiconductor device comprising:

a drift region of a first conductivity type, provided in a semiconductor substrate, the semiconductor substrate having an upper surface;

one or more mesa portions, each of the one or more mesa portions being defined at least in part by a gate trench portion extending into the semiconductor substrate from the upper surface of the semiconductor substrate;

one or more dummy trench portions, each of the one or more dummy trench portions being provided in the mesa portion, wherein the gate trench portion and the dummy trench portion extend in an extending direction, and are spaced apart in a trench array direction that is perpendicular to the extending direction, both the extending direction and the trench array direction are parallel with the upper surface of the semiconductor substrate, the gate trench portion is a first gate trench portion;

a base region of a second conductivity type provided above the drift region within each of the one or more mesa portions;

a first plurality of emitter regions of the first conductivity type, with a doping concentration higher than the drift region, being in contact with the first gate trench portion above the base region and being arranged along the extending direction of the first gate trench portion, each of the first plurality of emitter regions extends from the first gate trench portion toward the dummy trench portion in the trench array direction and reaches the dummy trench portion such that each of the first plurality of emitter regions is in contact with both the first gate trench portion and the dummy trench portion;

a contact region of the second conductivity type, with a doping concentration higher than the base region, provided above at least a portion of the base region within each of the one or more mesa portions, wherein in cross sections through each of the first plurality of emitter regions parallel to the trench array direction, the contact region is provided below a bottom of each of the first plurality of emitter regions, is in contact with the dummy trench portion, extends in a direction parallel to the trench array direction toward the first gate trench portion, and terminates without reaching the first gate trench portion;

an interlayer dielectric film provided above a first mesa region, of each of the one or more mesa portions, between the first gate trench portion and the dummy trench portion, wherein the first gate trench portion is a neighboring first gate trench portion of the dummy trench portion such that no other gate trench portion is located in the first mesa region and no other dummy trench portion is located in the first mesa region;

an emitter electrode provided above the interlayer dielectric film; and a contact trench portion extending into the first plurality of emitter regions from an upper surface of the interlayer dielectric film, wherein the semiconductor substrate is electrically connected to the emitter electrode via the contact trench portion, the contact trench portion is electrically connected to the contact region below the first plurality of emitter regions, the contact trench portion has a lower end, the emitter region has a lower end, and the lower end of the contact trench portion is deeper than the lower end of the emitter region.

11. The semiconductor device according to claim 10, wherein the contact region includes a first contact region and a second contact region, wherein in the upper surface of the semiconductor substrate, the first contact region and the second contact region are provided separately from each other in the extending direction by the first plurality of emitter regions, and the contact region provided below the bottom of each of the first plurality of emitter regions in cross sections through each of the first plurality of emitter regions parallel to the trench array direction, connects the first contact region and the second contact region below the bottom of each of the first plurality of emitter regions.

12. A semiconductor device comprising:

a drift region of a first conductivity type, provided in a semiconductor substrate, the semiconductor substrate having an upper surface;

one or more mesa portions, each of the one or more mesa portions being defined at least in part by a gate trench portion extending into the semiconductor substrate from the upper surface of the semiconductor substrate;

one or more dummy trench portions, each of the one or more dummy trench portions being provided in the mesa portion, wherein the gate trench portion and the dummy trench portion extend in an extending direction, and are spaced apart in a trench array direction that is perpendicular to the extending direction, both the extending direction and the trench array direction are parallel with the upper surface of the semiconductor substrate, the gate trench portion is a first gate trench portion, a base region of a second conductivity type, with a doping concentration higher than the drift region, provided above the drift region within each of the one or more mesa portions;

a first plurality of emitter regions of the first conductivity type, with a doping concentration higher than the drift region, being provided above the base region in contact with the first gate trench portion and being arranged along the extending direction of the first gate trench portion, each of the first plurality of emitter regions extending from the first gate trench portion toward the dummy trench portion in the trench array direction and being in contact with the dummy trench portion;

a contact region of the second conductivity type, with a doping concentration higher than the base region, provided above at least a portion of the base region within each of the one or more mesa portions;

an interlayer dielectric film provided above a first mesa region, of each of the one or more mesa portions, between the first gate trench portion and the dummy trench portion, wherein the first gate trench portion is a neighboring first gate trench portion of the dummy trench portion such that no other gate trench portion is located in the first mesa region and no other dummy trench portion is located in the first mesa region; and an emitter electrode provided above the interlayer dielectric film, wherein a contact hole is provided in the interlayer dielectric film, the semiconductor substrate is electrically connected to the emitter electrode via the contact hole, and in cross sections through each of the first plurality of emitter regions parallel to the trench array direction, the contact region is provided below a bottom of each of the first plurality of emitter regions, is in contact with the dummy trench portion, extends from the dummy trench portion toward the first gate trench portion in the trench array direction, and the contact region provided below the bottom of each of the first plurality of emitter regions terminates before the contact region provided below the bottom of each of the first plurality of emitter regions is overlapped by the contact hole.

13. The semiconductor device according to claim 12, wherein the contact region includes a first contact region and a second contact region, wherein in the upper surface of the semiconductor substrate, the first contact region and the second contact region are provided separately from each other in the extending direction by the first plurality of emitter regions, and the contact region provided below the bottom of each of the first plurality of emitter regions in cross sections through each of the first plurality of emitter regions parallel to the trench array direction, connects the first contact region and the second contact region below the bottom of each of the first plurality of emitter regions.

14. The semiconductor device according to claim 1, wherein the second extending portion of the gate trench portion is a dummy gate trench portion and no emitter regions are provided in contact with the second extending portion of the gate trench portion.

* * * * *